United States Patent [19]
Isa

[11] Patent Number: 5,798,973
[45] Date of Patent: Aug. 25, 1998

[54] SEMICONDUCTOR MEMORY DEVICE HAVING REDUNDANT MEMORY CELLS

[75] Inventor: Satoshi Isa, Tokyo, Japan

[73] Assignee: NEC Corporation, Tokyo, Japan

[21] Appl. No.: 865,164

[22] Filed: May 29, 1997

[30] Foreign Application Priority Data

May 30, 1996 [JP] Japan .................. 8-137152

[51] Int. Cl.$^6$ .................................................. G11C 7/00
[52] U.S. Cl. ........................... 365/200; 365/230.03
[58] Field of Search ................. 365/200, 230.03, 365/230.06

[56] References Cited

U.S. PATENT DOCUMENTS

| 5,381,370 | 1/1995 | Lacey et al. ........................... 365/200 |
| 5,475,648 | 12/1995 | Fujiwara ............................ 365/230.06 |
| 5,502,676 | 3/1996 | Pelley, III et al. ..................... 365/200 |
| 5,673,227 | 9/1997 | Engles et al. ......................... 365/200 |

FOREIGN PATENT DOCUMENTS 5-198199   8/1993   Japan.
7-93990    4/1995   Japan.

Primary Examiner—Son T. Dinh
Attorney, Agent, or Firm—Young & Thompson

[57] ABSTRACT

In a semiconductor memory device including a plurality of memory cell blocks and a plurality of redundant memory cell arrays each corrsponding to one of the memory cell blocks, a first selecting circuit selects memory cells from the memory cell blocks. Also, a redundant selection signal generating circuit generates redundant selection signals for the redundant memory cell arrays, and a redundant selection signal encoder encodes the redundant selection signals into redundant encode signals. A second selecting circuit decodes the redundant encode signals to select redundant memory cells from the redundant memory cell arrays. Further, when one of the redundant selection signals is generated, a deactivating circuit deactivates the first selecting circuit.

8 Claims, 27 Drawing Sheets

Fig. 2 PRIOR ART
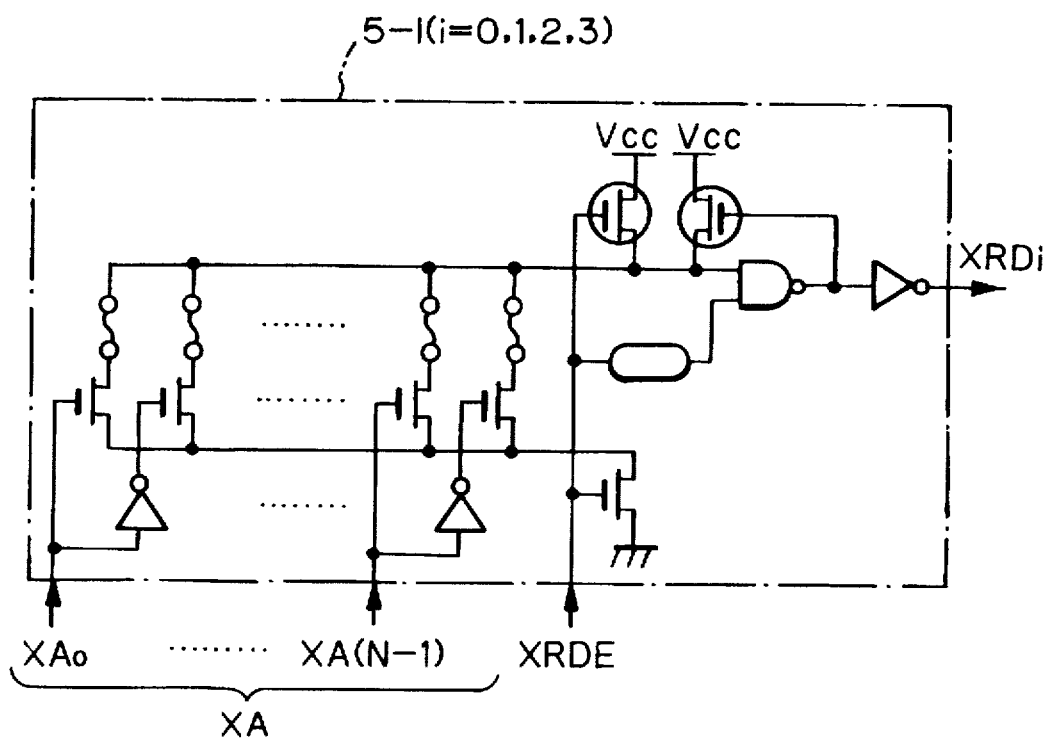
P-channel
N-channel
DELAY ELEMENT

| CASE | XRD0 | XRD1 | XRD2 | XRD3 | RXDS0 | RXDS1 | XRDN |
|------|------|------|------|------|-------|-------|------|
| I    | H    | L    | L    | L    | L     | L     | L    |
| II   | L    | H    | L    | L    | H     | L     | L    |
| III  | L    | L    | H    | L    | L     | H     | L    |
| IV   | L    | L    | L    | H    | H     | H     | L    |
| V    | L    | L    | L    | L    | H     | H     | H    |

| XRD | RMW | RSW | RSS0 | RSS1 |
|-----|------|--------|------|------|
| 0 | RMW0 | RSW0,1 | H | L |
| 1 | RMW0 | RSW2,3 | L | H |
| 2 | RMW1 | RSW0,1 | H | L |
| 3 | RMW1 | RSW2,3 | L | H |
| 4 | RMW2 | RSW0,1 | H | L |
| 5 | RMW2 | RSW2,3 | L | H |
| 6 | RMW3 | RSW0,1 | H | L |
| 7 | RMW3 | RSW2,3 | L | H |

| XRD | RMW | RSW | RSS1 |
|---|---|---|---|
| 0 | RMW0 | RSW0,1 | L |
| 1 | RMW0 | RSW2,3 | H |
| 2 | RMW1 | RSW0,1 | L |
| 3 | RMW1 | RSW2,3 | H |
| 4 | RMW2 | RSW0,1 | L |
| 5 | RMW2 | RSW2,3 | H |
| 6 | RMW3 | RSW0,1 | L |
| 7 | RMW3 | RSW2,3 | H |

5,798,973

SEMICONDUCTOR MEMORY DEVICE HAVING REDUNDANT MEMORY CELLS

BACKGROUND OF THE INVENTION

1. Field of the Invention

The present invention relates to a semiconductor memory device incorporating redundant memory cells.

2. Description of the Related Art

In a prior art semiconductor memory device incorporating redundant memory cells, if a defective memory cell is found, the address of the defective memory cell is written into a redundant decoder by laser trimming or the like. As a result, when such a defective address is received by the redundant decoder, the redundant decoder deactivates its corresponding normal decoder and, in its place, selects the redundant memory cell, to thereby replace the defective memory cell with the redundant memory cell. Thus, the defective memory cell is alleviated (see JP-A-5-198199 & JP-A-7-93990).

In prior art semiconductor devices, since the number of lines for redundant selection signals of the redundant decoder is substantially increased, the integration is reduced. Also, the freedom of replacement of a defective memory cell with a redundant memory cell is small, thus reducing the manufacturing yield. This will be explained later in detail.

SUMMARY OF THE INVENTION

It is an object of the present invention to enhance the integration of a semiconductor memory device incorporating redundant memory cells.

Another object is to enhance the freedom of replacement of defective memory cells with redundant memory cells.

According to the present invention, in a semiconductor memory device including a plurality of memory cell blocks and a plurality of redundant memory cell arrays each corresponding to one of the memory cell blocks, a first selecting circuit selects memory cells from the memory cell blocks. Also, a redundant selection signal generating circuit generates redundant selection signals for the redundant memory cell arrays, and a redundant selection signal encoder encodes the redundant selection signals into redundant encode signals. A second selecting circuit decodes the redundant encode signals to select redundant memory cells from the redundant memory cell arrays. Further, when one of the redundant selection signals is generated, a deactivating circuit deactivates the first selecting circuit.

BRIEF DESCRIPTION OF THE DRAWINGS

The present invention will be more clearly understood from the description as set forth below, as compared with the prior art, with reference to the accompanying drawings, wherein:

FIG. 2 is a circuit diagram of the redundant row decoder of FIG. 1;

DESCRIPTION OF THE PREFERRED EMBODIMENTS

Before the preferred embodiments, prior art semiconductor memory devices will be explained with reference to FIGS. 1 through 8.

Figure 1:
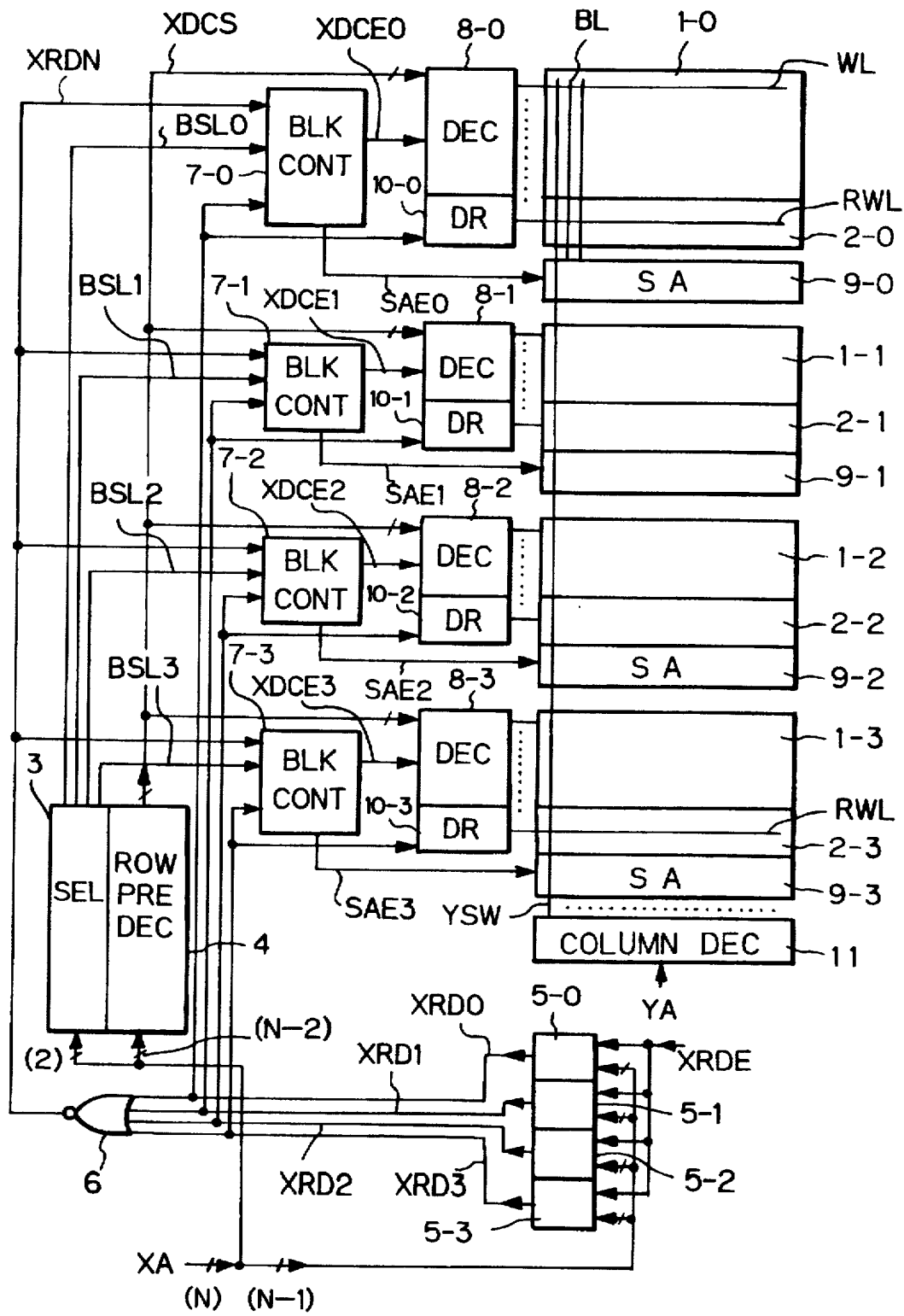
FIG. 1 is a block circuit diagram illustrating a first prior art semiconductor memory device.

In FIG. 1, which illustrates a first prior art semiconductor memory device, reference numerals 1-0, 1-1, 1-2 and 1-3 designate memory cell blocks each including memory cells at intersections between word lines such as WL and bit lines such as BL. Also, reference numerals 2-0, 2-1, 2-2 and 2-3 designate redundant memory cell arrays each including a row of redundant memory cells at intersections between a redundant word line such as RWL and the bit lines such as BL. Note each of the redundant memory cell arrays 2-0, 2-1, 2-2 and 2-3 are associated with the memory cell blocks 1-0, 1-1, 1-2 and 1-3, respectively. Also, all the bit lines BL are in common for the memory cell blocks 1-0, 1-1, 1-2 and 1-3 and the redundant memory cell arrays 2-0, 2-1, 2-2 and 2-3.

A block selector 3 receives two upper bits (N-2) of an N-bit row address signal XA to generate block selection signals BSLO, BL1, BL2 and BL3 for the memory cell blocks 1-0, 1-1, 1-2 and 1-3, respectively. Thus, one of the memory cell blocks 1-0, 1-1, 1-2 and 1-3 is selected. Also, a row predecoder 4 receives the (N-2)-bit row address signal XA except for the two upper bits to generate a predecode signal XDCS for the memory cell blocks 1-0, 1-1, 1-2 and 1-3.

Redundant row decoders (redundant address program circuits) 5-0, 5-1, 5-2 and 5-3 are provided for the redundant memory cell arrays 2-0, 2-1, 2-2 and 2-3, respectively. For example, when a defective memory cell is found in the memory cell block 1-0, a row address of this defective memory cell (hereinafter, referred to as a defective row address) is written into the redundant row decoder 5-0. As a result, when the redundant row decoder 5-0 receives the defective row address indicated by the row address signal XA, the redundant row decoder 5-0 generates a redundant selection signal XRDO for the redundant memory cell array 2-0. Also, a replacement determination circuit 6 is formed by a NOR circuit which receives the redundant selection signals XRD0, XRD1, XRD2 and XRD3. That is, when at least one of the redundant selection signals XRD0, XRD1, XRD2 and XRD3 is high (active) so that one row of memory cells is replaced by its corresponding redundant row, the replacement determination circuit 6 generates a replacement determination signal XRDN for deactivating the memory cell blocks 1-0, 1-1, 1-2 and 1-3.

Block control circuit 7-0, 7-1, 7-2 and 7-3 are provided for the memory cell blocks 1-0, 1-1, 1-2 and 1-3, respectively. For example, the block control circuit 7-0 receives the block selection signal BSL0 from the block selector 3, the redundant selection signal XRD0 from the redundant row decoder 5-0, and the replacement determination signal XRDN from the replacement determination circuit 6. When the replacement determination signal XRDN is high (inactive) and the block selection signal BSL0 is high (active), the block control circuit 7-0 generates a row decoder activation signal XDCE0 for a row decoder/driver circuit 8-0 and a sense amplifier activation signal SAE0 for a sense amplifier circuit 9-0. On the other hand, when the replacement determination signal XRDN is low (active), the block control circuit 7-0 deactivates the row decoder activation signal XDCE0. Also, when the redundant selection signal XRD0 is high (active), the block control circuit 7-0 makes the sense amplifier activation signal SAE0 high (active).

Row decoder/driver circuits 8-1, 8-2 and 8-3 as well as the row decoder/driver circuit 8-0 are provided for the memory cell blocks 1-0, 1-1, 1-2 and 1-3. The row decoder/driver circuit 8-0, 8-1, 8-2 or 8-3 is activated by the row decoder activation signals XDCE0, XDCE1, XDCE2 or XDCE3, to select one row of memory cells in accordance with the predecode signal XDCS.

Redundant row driver circuits 10-0, 10-1, 10-2 and 10-3 are provided for the redundant memory cell arrays 2-0, 2-1, 2-2 and 2-3, respectively. The redundant row driver circuit 10-0, 10-1, 10-2 or 10-3 is activated by the redundant selection signals XRD0, XRD1, XRD2 or XRD3, to select one row of redundant memory cells.

Sense amplifier circuits 9-1, 9-2 and 9-3 as well as the sense amplifier circuit 9-0 are provided for sensing data in the memory cell blocks 1-0, 1-1, 1-2 and 1-3 and the redundant memory cell arrays 2-0, 2-1, 2-2 and 2-3. In this case, the sense amplifier circuit 9-0 is provided commonly for the memory cell block 1-0 and the redundant memory cell array 2-0; the sense amplifier circuit 9-1 is provided commonly for the memory cell block 1-1 and the redundant memory cell array 2-1; the sense amplifier circuit 9-2 is provided commonly for the memory cell block 1-2 and the redundant memory cell array 2-2; and the sense amplifier circuit 9-3 is provided commonly for the memory cell block 1-3 and the redundant memory cell array 2-3.

The sense amplifier circuits 9-0, 9-1, 9-2 and 9-3 include transfer gates connected to the bit lines. The transfer gates are controlled by Y switch signals generated by a column decoder 11 which receives a column address signal YA. As a result, one column of memory cells including redundant memory cells is selected from each of the memory cell blocks 1-0, 1-1, 1-2 and 1-3 including the redundant memory cell arrays 2-0, 2-1, 2-2 and 2-3.

As illustrated in FIG. 2, the redundant row decoder 5-i (i=0, 1, 2, 3) is formed by a fuse-type programmable read-only memory (PROM). A defective row address defined by all the bits (N bits) of the row address signal XA in the memory cell block 1-i is written into the redundant row decoder 5-i, i.e., the fuses of the fuse-type ROM are trimmed by the laser. All the redundant row decoders 5-0, 5-1, 5-2 and 5-3 are activated by a redundant decoder enable signal XRDE.

Figure 3:
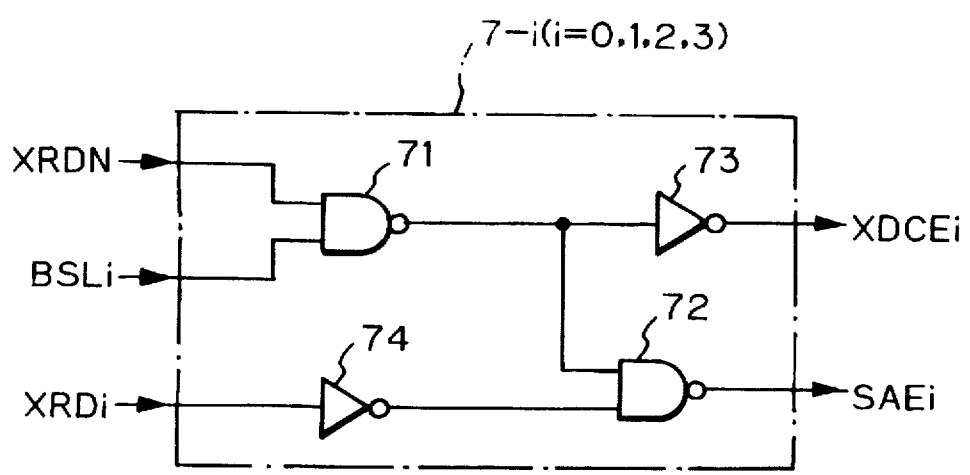
FIG. 3 is a circuit diagram of the block control circuit of FIG. 1.

As illustrated in FIG. 3, the block control circuit 7-i is formed by NAND circuits 71 and 72 and inverters 73 and 74. When the replacement determination signal XRDN is high (inactive) and the block selection signal BSLi is high (active), the output of the NAND circuit 71 is made low, so that the row decoder activation signal XDCEi is high (active) by the inverter 73, and the sense amplifier activation signal SAEi is made high (active) by the NAND circuit 72. On the other hand, when the replacement determination signal XRDN is low (active), the output of the NAND circuit 71 is high, so that the row decoder activation signal XDCEi is made low (inactive) by the inverter 73. In this case, the sense amplifier activation signal SAEi is the same as the redundant selection signal XRDi.

In the semiconductor memory device of FIG. 1, however, since four lines for the redundant selection signals XRD0, KRD1, XRD2 and XRD3 are connected between the redundant row decoders 5-0, 5-1, 5-2 and 5-3 and the block control circuits 7-0, 7-1, 7-2 and 7-3 (the redundant row driver circuits 10-0, 10-1, 10-2 and 10-3), the integration is reduced.

Figure 4:
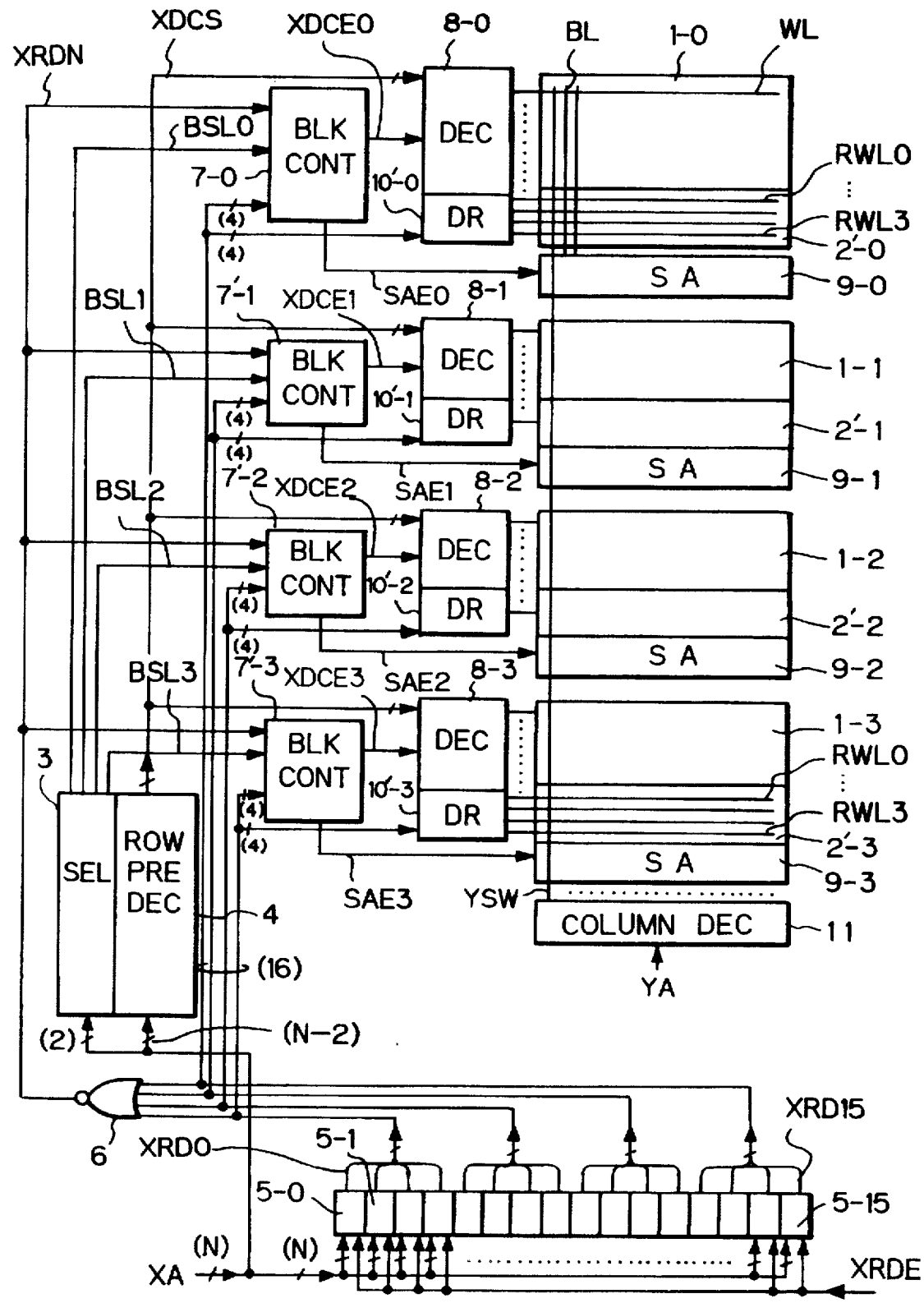
FIG. 4 is a block circuit diagram illustrating a second prior art semiconductor memory device.
Figure 5:
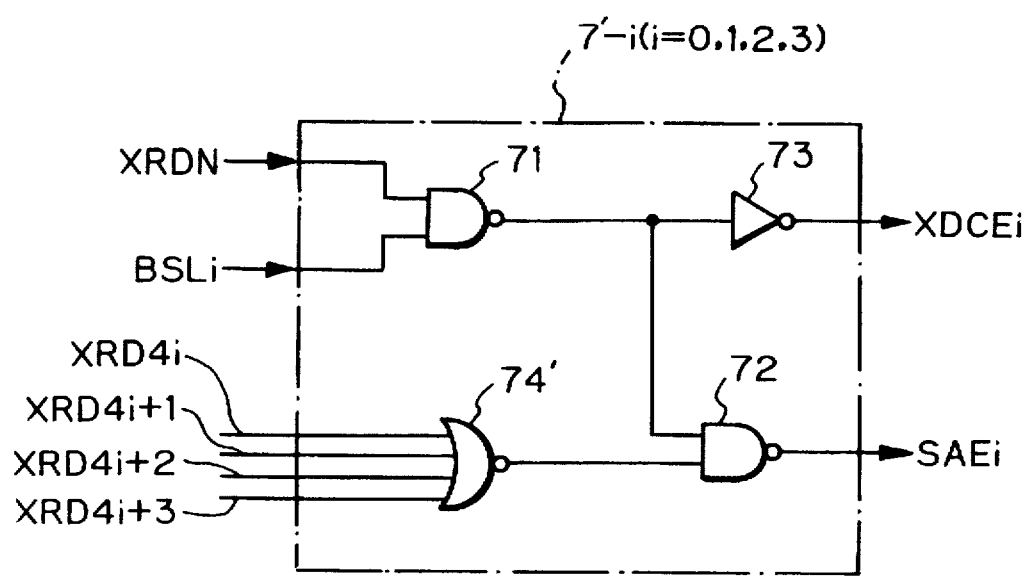
FIG. 5 is a circuit diagram of the block control circuit of FIG. 4.

In FIG. 4, which illustrates a second prior art semiconductor memory device, redundant memory cell arrays 2'-0, 2'-1, 2'-2 and 2'-3 are provided instead of the redundant memory cell arrays 2-0, 2-1, 2-2 and 2-3 of FIG. 1. Each of the redundant memory cell arrays 2'-0, 2'-1, 2'-2 and 2'-3 includes four rows of redundant memory cells between redundant word lines RWL0, RWL1, RWL2 and RWL3 and the bit lines such as SL. That is, sixteen rows of redundant memory cells are provided, and therefore, sixteen redundant row decoders 5-0, 5-1, . . . , 5-15 are provided. Also, block control circuits 7'-0, 7'-1, 7'-2 and 7'-3 are provided instead of the block control circuits 7-0, 7-1, 7-2 and 7-3 of FIG. 1. Each of the block control circuits 7'-0, 7'-1, 7'-2 and 7'-3 are illustrated in FIG. 5, where a NOR circuit 74' is provided instead of the inverter 74. Further, redundant row driver circuits 10'-0, 10'-1, 10'-2 and 10'-3 are provided instead of the redundant row driver circuits 10-0, 10-1, 10-2 and 10-3 of FIG. 1. Each of the redundant row driver circuits 10'-0, 10'-1, 10'-2 and 10'-3 drives one of the four rows of redundant memory cells.

In the semiconductor memory device of FIG. 4, however, since sixteen lines for the redundant selection signals XRD0 through XRD15 are connected between the redundant row decoders 5-0 through 5-15 and the block control circuits 7'-0, 7'-1, 7'-2 and 7'-3 (the redundant row driver circuits 10'-0, 10'-1, 10'-2 and 10'-3), the integration is reduced.

Figure 6:
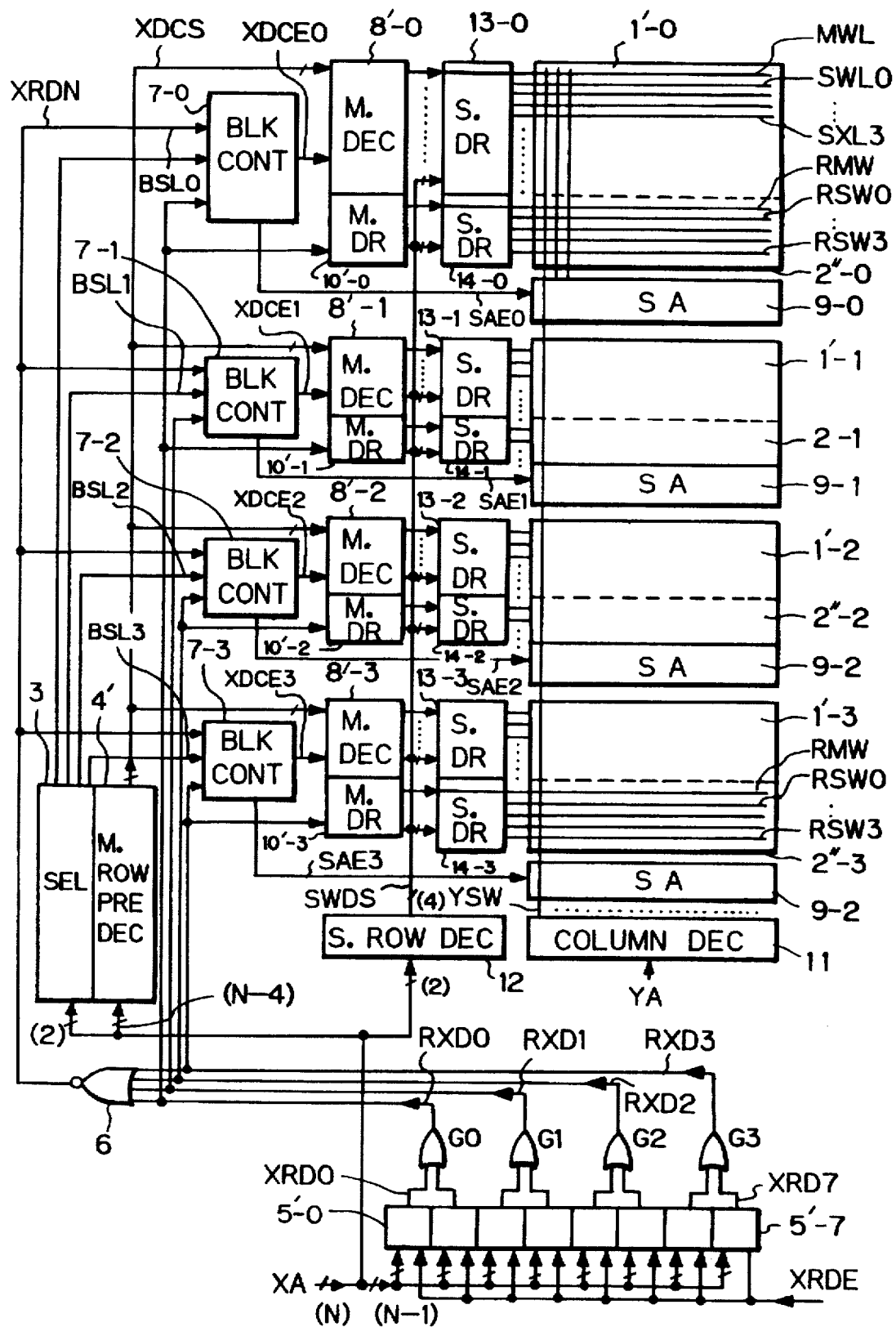
FIG. 6 is a block circuit diagram illustrating a third prior art semiconductor memory device.

In FIG. 6, which illustrates a third prior art semiconductor memory device, each of memory cell blocks 1'-0, 1'-1, 1'-2 and 1'-3 includes main word lines MWL each associated with four sub word lines SWL0, SWL1, SWL2 and SWL3, and memory cells at intersections between the sub word lines and the bit lines BL. Similarly, each of redundant memory cell arrays 2"-0, 2"-1, 2"-2 and 2"-3 includes redundant main word lines RMW each associated with four redundant sub word lines RSW0, RSW1, RSW2 and RSW3, and redundant memory cells at intersections between the redundant sub word lines and the bit lines BL. A main row predecoder 4' receives the (N-4)-bit row address signal XA except for the four upper bits to generate a predecode signal XDCS for the memory cell blocks 1-0, 1-1, 1-2 and 1-3.

Redundant row decoders 5'-0 and 5'-1 are provided for the redundant memory cell array 2"-0, and therefore, redundant selection signals XRD0 and XRD1 of the redundant row decoders 5'-6 and 5'-1 are combined by an OR circuit G0 into a main redundant selection signal RXD0 for the redundant memory cell array 2"-0. Also, redundant row decoders 5'-2 and 5'-3 are provided for the redundant memory cell array 2"-1, and therefore, redundant selection signals XRD1 and XRD2 of the redundant row decoders 5'-2 and 5'-3 are combined by an OR circuit G1 into a main redundant selection signal RXD1 for the redundant memory cell array 2'-1. Similarly, redundant row decoders 5'-4 and 5'-5 are provided for the redundant memory cell array 2"-2, and therefore, redundant selection signals XRD4 and XRD5 of the redundant row decoders 5'-4 and 5'-5 are combined by an OR circuit G2 into a main redundant selection signal RXD2 for the redundant memory cell array 2"-2. Also, redundant row decoders 5'-6 and 5'-7 are provided for the redundant memory cell array 2"-3, and therefore, redundant selection signals XRD6 and XRD7 of the redundant row decoders 5'-6 and 5'-7 are combined by an OR circuit G3 into a main redundant selection signal RXD3 for the redundant memory cell array 2"-3.

The main redundant selection signals RXD0, RXD1, RXD2 and RXD3 instead of the redundant selection signals XRD0, XRD1, XRD2 and XRD3 of FIG. 1 are supplied to the block control circuits 7-0, 7-1, 7-2 and 7-3 and the like.

Main row decoder/driver circuits 8'-0, 8'-1, 8'-2 and 8'-3 correspond to the row decoder/driver circuits 8-0, 8-1, 8-2 and 8-3, respectively. The main row decoder/driver circuit 8'-0, 8'-1, 8'-2 or 8'-3 is activated by the row decoder activation signals XDCE0, XDCE1, XDCE2 or XDCE3, to select one main word line MWL in accordance with the predecode signal XDCS.

Redundant main row driver circuits 10'-0, 10'-1, 10'-2 and 10'-3 correspond to the redundant row driver circuits 10-0, 10-1, 10-2 and 10-3, respectively. The redundant main row driver circuit 10'-0, 10'-1, 10'-2 or 10'-3 is activated by the redundant selection signal RXD0, RXD1, RXD2 or RXD3, to select one redundant main word line RMW.

Also, a sub row decoder 12, sub row driver circuit 13-0, 13-1, 13-2 and 13-3, and redundant sub driver circuits 14-0, 14-1, 14-2 and 14-3 are provided. The sub row decoder 12 receives two lower bits XA0 and XA1 of the row address signal XA to generate a four-bit decode signal SWDS. The four-bit decode signal SWDS is supplied to the sub row driver circuits 13-0, 13-1, 13-2 and 13-3 and the redundant row driver circuits 14-0, 14-1, 14-2 and 14-3.

The sub row driver circuit 13-0, 13-1, 13-2 and 13-3 select one of the sub word lines SWL0, SWL1, SWL2 and SWL3 connected to a selected main word line MWL in accordance with the four-bit decode signal SWDS. As a result, one row of memory cells is selected within the memory cell blocks 1'-0, 1'-1, 1'-2 and 1'-3.

The redundant sub row driver circuits 14-0, 14-1, 14-2 and 14-3 select one of the redundant sub word lines RSW0, RSW1, RSW2 and RSW3 connected to a selected redundant main word line RMW in accordance with the four-bit decode signal SWDS. As a result, one row of redundant memory cells is selected within the redundant memory cell arrays 2"-0, 2"-1, 2"-2 and 2"-3.

Figure 7:
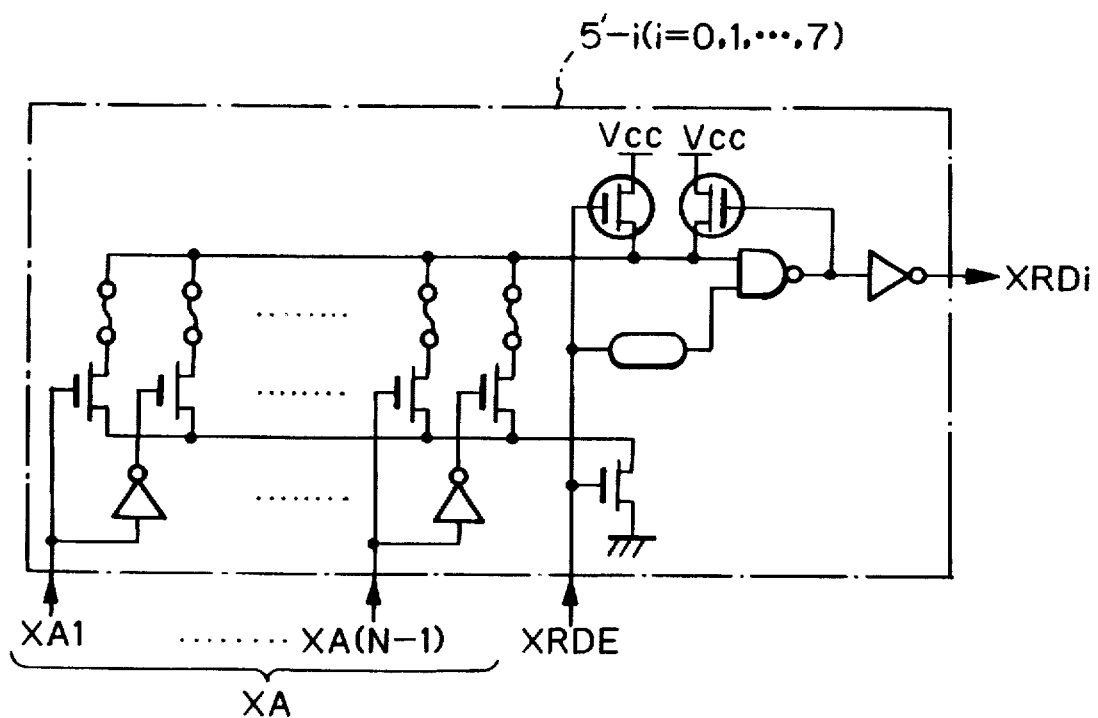
FIG. 7 is a circuit diagram of the redundant row decoder of FIG. 6.

As illustrated in FIG. 7, the redundant row decoder 5'-i (i=0, 1, . . . , 7) is formed by a fuse-type programmable read-only memory (PROM). A defective row address defined by the (N-1) bits of the row address signal XA except for the lowest bit XA0 in the memory cell block 1-i is written into the redundant row decoder 5-i, i.e., the fuses of the fuse-type ROM are trimmed by the laser. That is, one redundant row decoder covers two row addresses whose bits XA1, XA2, ... XA(N-1) are the same, i.e., two rows of memory cells. Since four redundant sub word lines RSW0, RSW1, RSW2 and RsW3 are provided for one redundant main word line RMW, two redundant row decoders share one redundant main word line, and two redundant sub word lines share one redundant row decoder.

Figure 8:
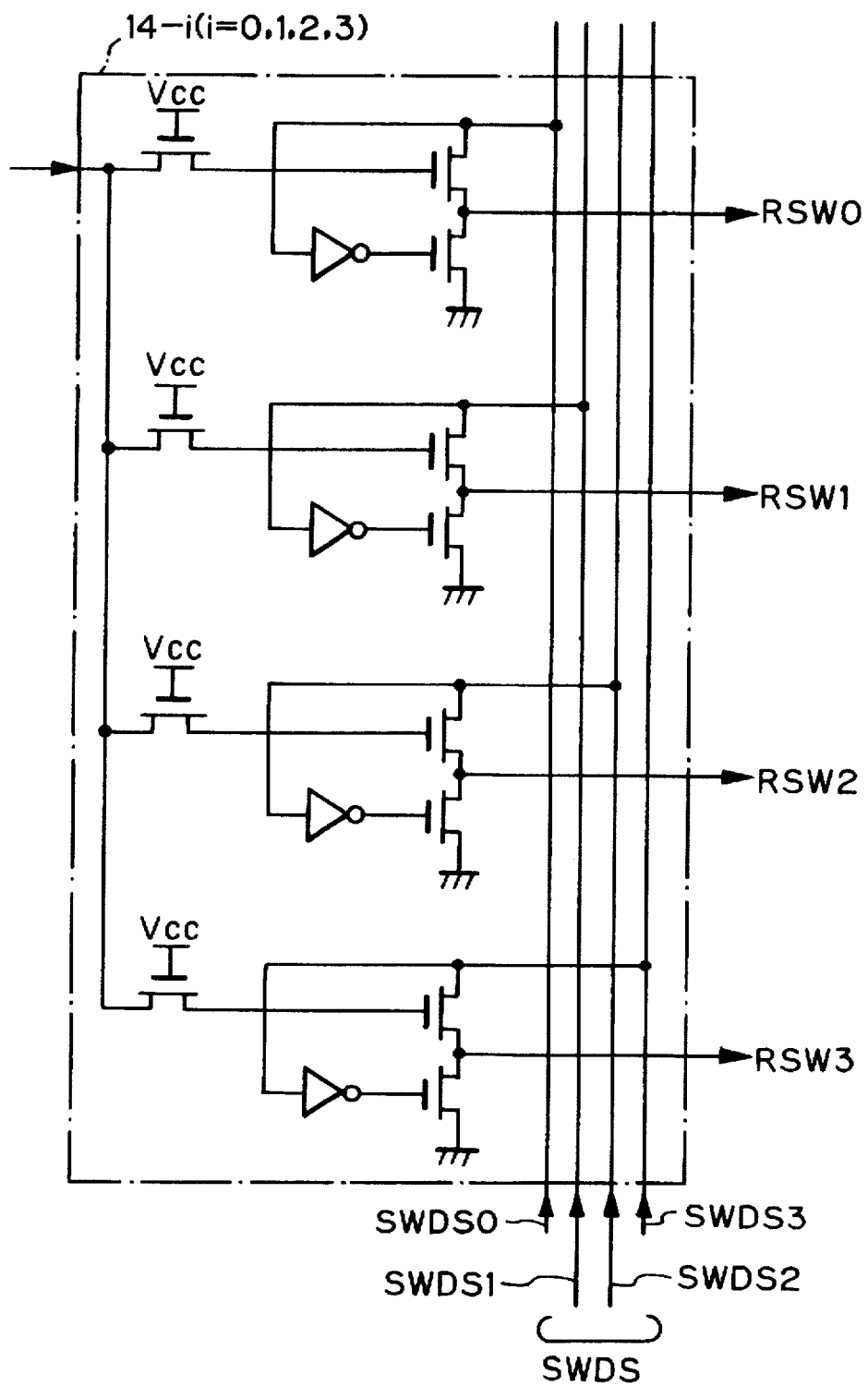
FIG. 8 is a circuit diagram of the redundant sub row decoder of FIG. 6.

The redundant sub row driver circuit 14-i (i=0, 1, 2, 3) is illustrated in FIG. 8. That is, when the redundant main word line RMW is selected, one of the redundant sub word lines RSW0, RSW1, PSW2 and RSW3 is selected in accordance with the four bits SWDS0, SWDS1, SWDS2 and SWDS3. Note that the sub row driver circuits 13-0, 13-1, 13-2 and 13-3 have a similar configuration to that of FIG. 8. Therefore, the main word lines such as MWL and the redundant main word lines such as RMW are not located in the memory cell blocks 1'-0, 1'-1, 1'-2 and 1'-3 and the redundant memory cell arrays 2"-0, 2"-1, 2"-2 and 2"-3.

In FIG. 6, a defective row can be replaced by a redundant row; in this case, the sub word lines SWL0 and SWL1 can be replaced by their corresponding redundant sub word lines RSW0 and RSW1, and the sub word lines SWL2 and SWL3 can be replaced by their corresponding redundant sub word lines RSW2 and RSW3.

In the semiconductor memory device of FIG. 6, however, since four lines for the redundant selection signals RXD0, RXD1, RXD2 and RXD3 are connected between the OR circuits G0, G1, G2 and G3 and the block control circuits 7-0, 7-1, 7-2 and 7-3 (the redundant main row drivers 10'-0, 10'-1, 10'-2 and 10'-3), the integration is reduced. In addition, since four lines for the decode signal SWDS are connected between the sub row decoder 12 and the sub row driver circuits 13-0, 13-1, 13-2 and 13-3 (the redundant sub row driver circuits 14-0, 14-1, 14-2 and 14-3), the integration is also reduced. Further, since the relationship between sub word lines and redundant sub word lines to be replaced with the sub word lines is limited, the freedom of replacement is small, which reduces the manufacturing yield.

Figure 9:
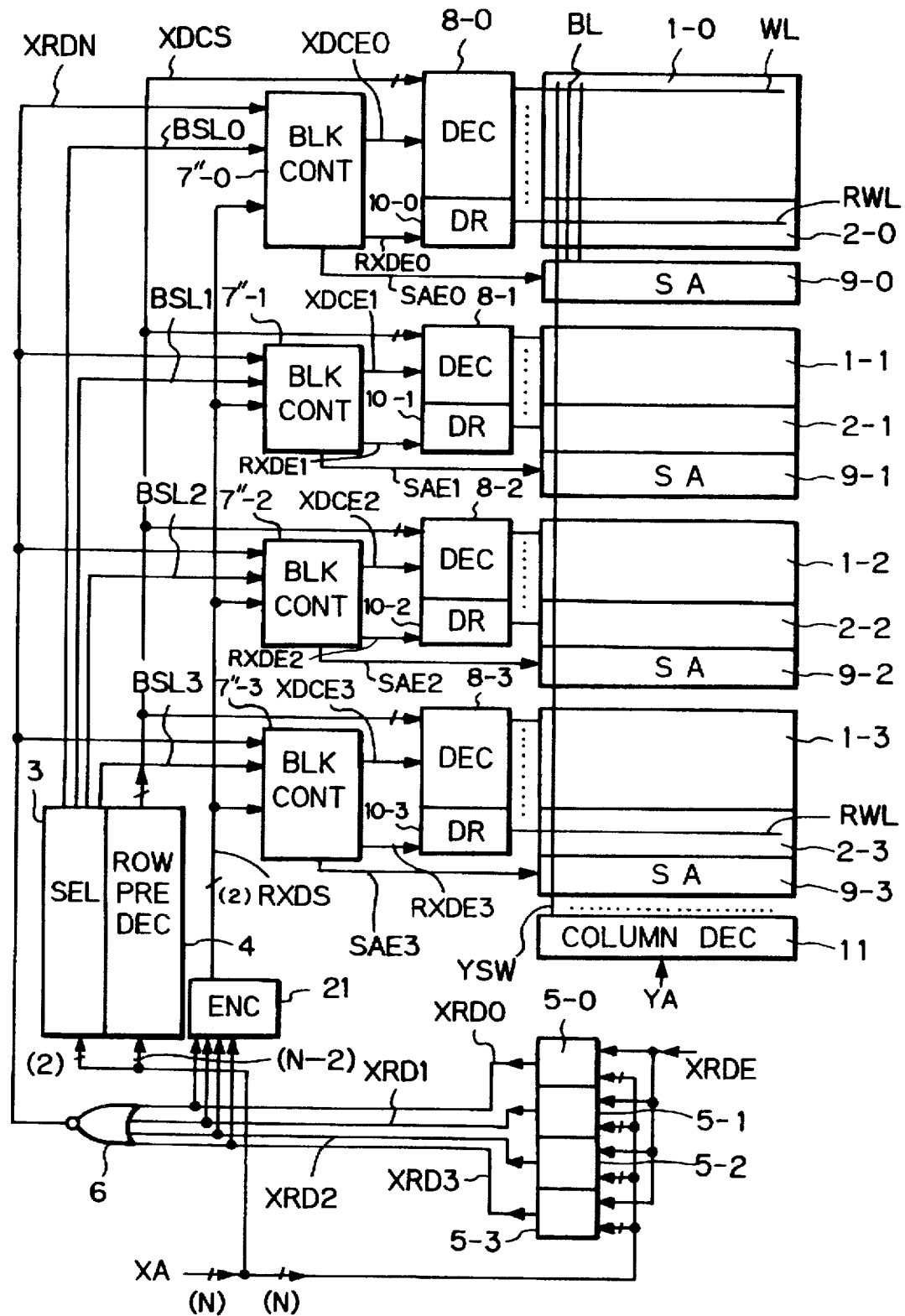
FIG. 9 is a block circuit diagram illustrating a first embodiment of the semiconductor memory device according to the present invention.

In FIG. 9, which illustrates a first embodiment of the present invention, a redundant row encoder 21 is added to the elements of FIG. 1, and the block control circuits 7-0, 7-1, 7-2 and 7-3 of FIG. 1 are modified into block control circuits 7"-0, 7"-1, 7"-2 and 7"-3, respectively.

Figures 10A, 10B:
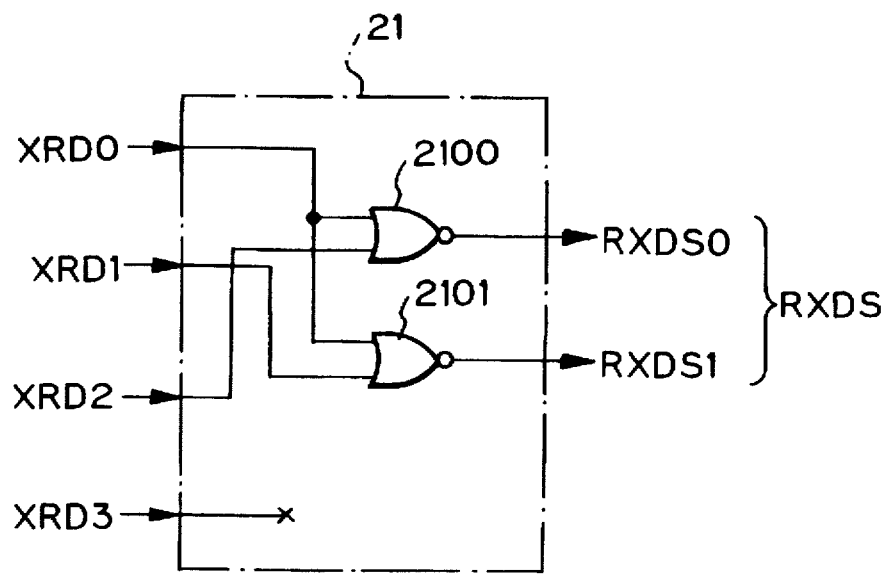
FIG. 10A is a circuit diagram of the redundant row encoder of FIG. 9.
FIG. 10B is a table showing a relationship between the inputs and outputs of the redundant row encoder of FIG.

The redundant row encoder 21 encodes the four redundant selection signals XRD0, XRD1, XRD2 and XRD3 into a two-bit redundant row encode signal RXDS including two bits RXDS0 and RXDS1. The redundant row encoder 21 is illustrated in FIG. 10A. That is, the redundant row encoder 21 is formed by two NOR circuits 2100 and 2101. The redundant selection signals XRD0 and XRD2 are supplied to the NOR circuit 2100 to generate the redundant row encode signal RXDS0. Also, the redundant selection signals XRD0 and XRD1 are supplied to the NOR circuit 2101 to generate the redundant row encode signal RXDS1.

In the redundant row encoder 21, the relationships between the inputs and the outputs are shown in FIG. 10B. Particularly, in case IV, when the redundant selection signal XRD3 is high, the redundant row encode signals RXDS0 and RXDS1 are both high. Also, in case V, when all the redundant selection signals XRD0, XRD1, XRD2 and XRD3 are low, the redundant row encode signals RXDS0 and RXDS1 are also both high. Note that the two cases IV and V can be discriminated from each other in the block control circuit 7"-3 by the replacement determination signal XRDN.

Generally, the redundant row encoder 21 can be constructed to encode a $2^n$-bit input signal to an n-bit output signal (in FIG. 9, n=2).

The block control circuits 7"-0, 7"-1, 7"-2 and 7"-3 are illustrated in FIGS. 11A, 11B, 11C and 11D. That is, the block control circuit 7"-0, (7"-1, 7"-2, 7"-3) is formed by two NAND circuits 701 and 702 (711, 712; 721, 722; 731, 732) corresponding to the NAND circuits 71 and 72 of FIG. 3, two inverters 703 and 704 (713, 714; 723, 724; 733, 734) corresponding to the inverters 73 and 74 of FIG. 3, a decoder 705 (715, 725, 735), a NAND circuit 706 (716, 726, 736), and an inverter 707 (717, 727, 737). In the decoder 705, 715, 725 and 735, the presence of inverters corresponds to the low level logic of the redundant row encode signals RXDS0 and RXDS1 of FIG. 10B. Particularly, in FIG. 11D, since the replacement determination signal XRDN is supplied via the inverter 733 to the NAND circuit 736, the cases IV and V of FIG. 10B can be discriminated from each other by the output of the NAND circuit 736.

Figure 11A:
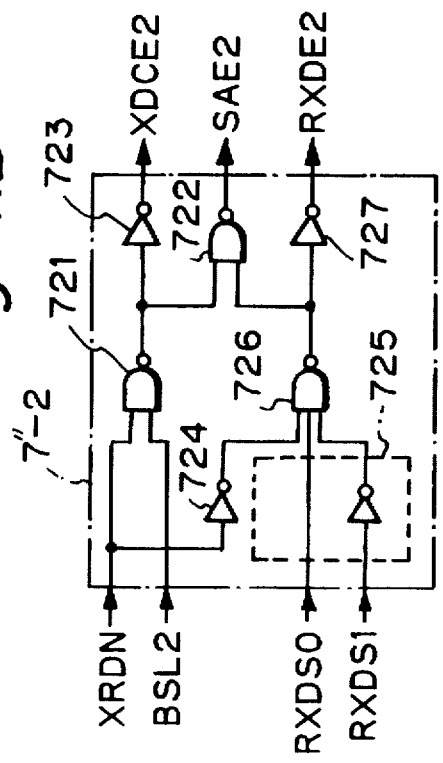
FIGS. 11A, 11B, 11C and 11D are circuit diagrams of the block control circuits of FIG. 9.
Figure 11B:
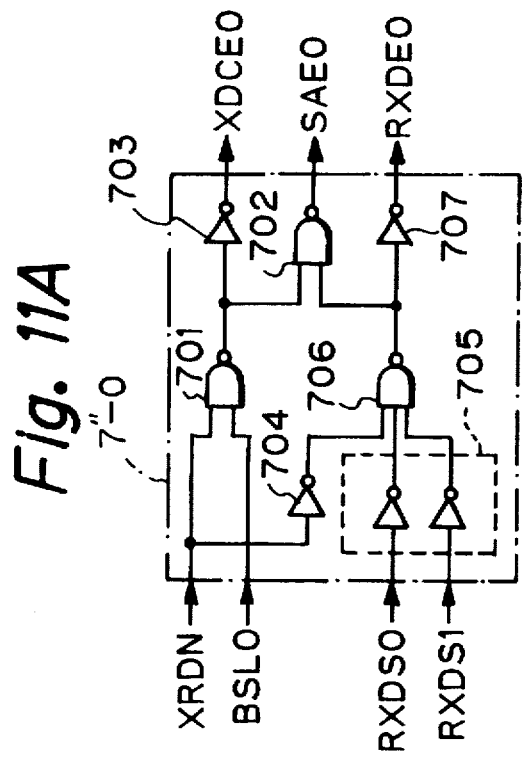
Figure 11C:
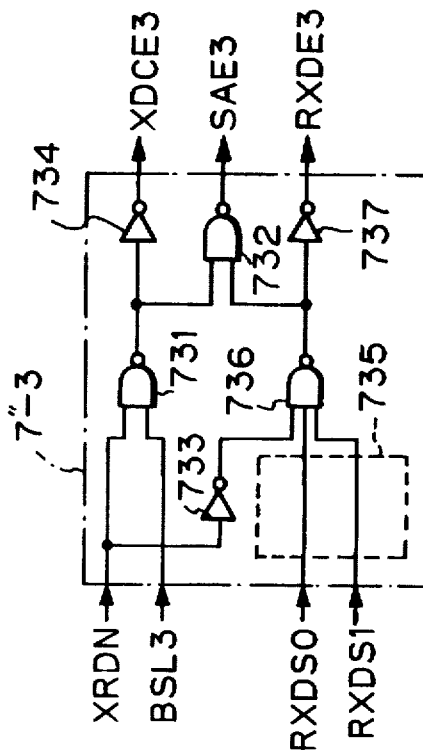
Figure 11D:
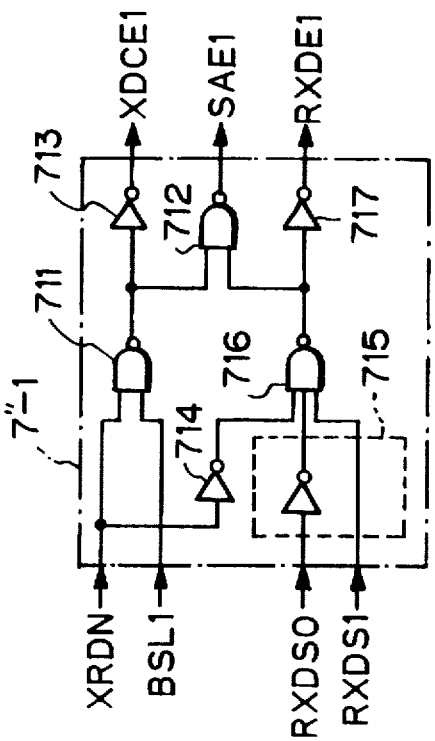

Note that the inverters 704, 714 and 724 of FIGS. 11A, 11B and 11C can be omitted.

In FIG. 9, when the replacement determination signal XRDN is high (inactive) and the block selection signal BSLi is high (active), the block control circuit 7"-i generates a row decoder activation signal XDCEi for the row decoder/driver circuit 8-i and a sense amplifier activation signal SAEi for the sense amplifier circuit 9-i. In this case, a redundant row selection signal RXDEi is not generated. On the other hand, when the replacement determination signal XRDN is low (active), i.e., when one of the redundant selection signals XRD0, XRD1, XRD2 and XRD3 is high (active), the block control circuit 7"-i deactivates the row decoder activation signal XDCEi. In this case, when the redundant selection signal XRDi is high (active), the outputs of the decoder of the block control circuit 7"-i are both high, so that the sense amplifier activation signal SAEi for the sense amplifier circuit 9-i and the redundant row selection signal RXDEi for the redundant memory cell array 2-i are activated.

Thus, in the semiconductor memory device of FIG. 9, since only two lines for the redundant row encode signals RXDS0 and RXDS1 are connected between the redundant row encoder 21 and the block control circuits 7"-0, 7"-1, 7"-2 and 7"-3, the integration can be enhanced as compared with the semiconductor memory device of FIG. 1. Note that if the devices of FIGS. 1 and 9, have $2^n$ rows of redundant memory cells, the number of lines between the redundant row decoders (the redundant row encoder) and the block control circuits can be reduced from $2^n$ to n. Therefore, when the value n is larger, the integration can be further enhanced.

Figure 12:
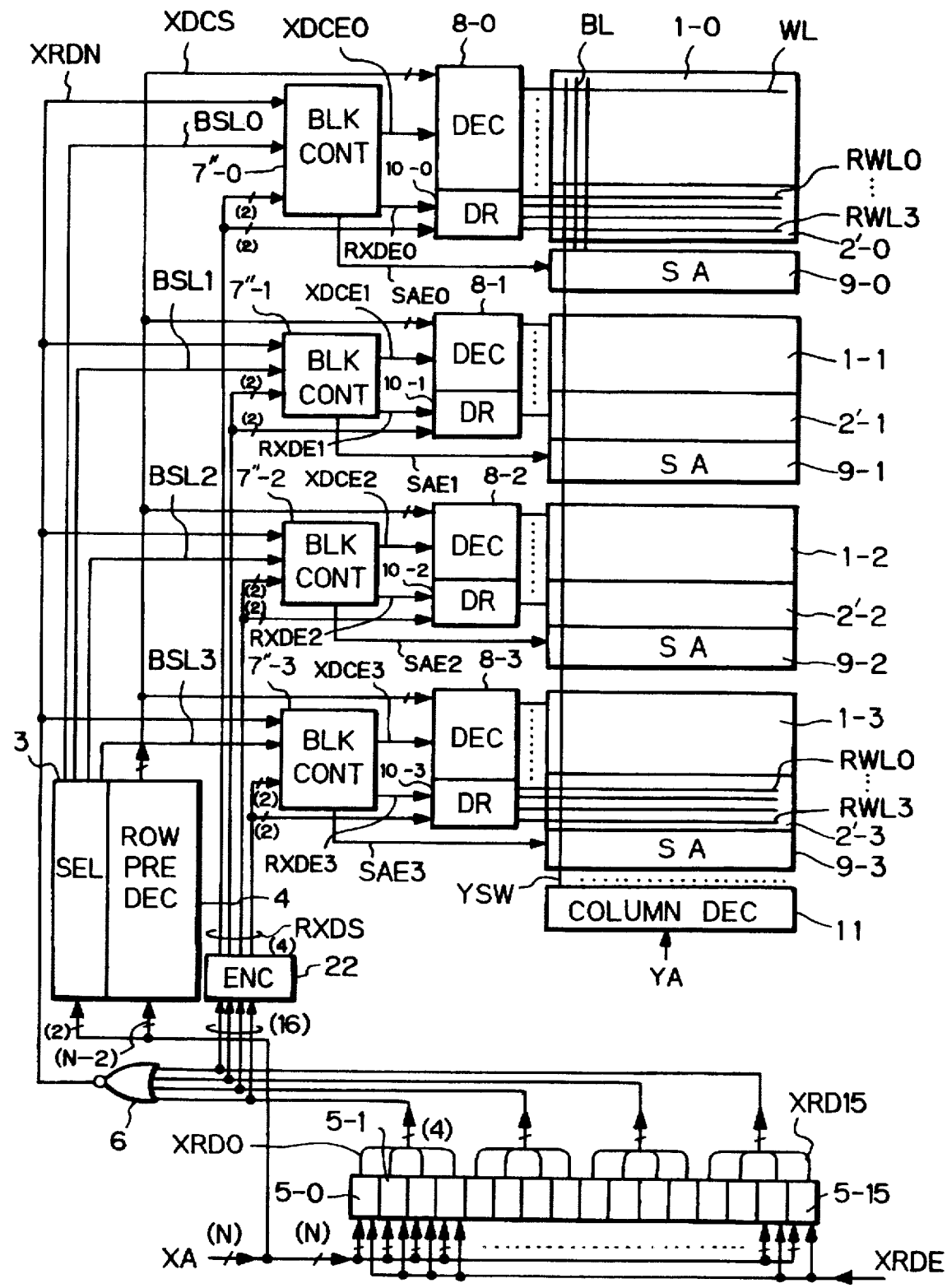
FIG. 12 is a block circuit diagram illustrating a second embodiment of the semiconductor memory device according to the present invention.

In FIG. 12, which illustrates a second embodiment of the present invention, a redundant row encoder 22 is added to the elements of FIG. 4. Also, the block control circuits 7'-0, 7'-1, 7'-2 and 7'-3 of FIG. 4 are modified into block control circuits 7"-0, 7"-1, 7"-2 and 7"-3, respectively, which have decoding functions, and the redundant row driver circuits 10'-0, 10'-1, 10'-2 and 10'-3 of FIG. 4 are modified into redundant row decoder/driver circuits 10"-0, 10"-1, 10"-2 and 10"-3, respectively, which have decoding functions.

Figure 13:
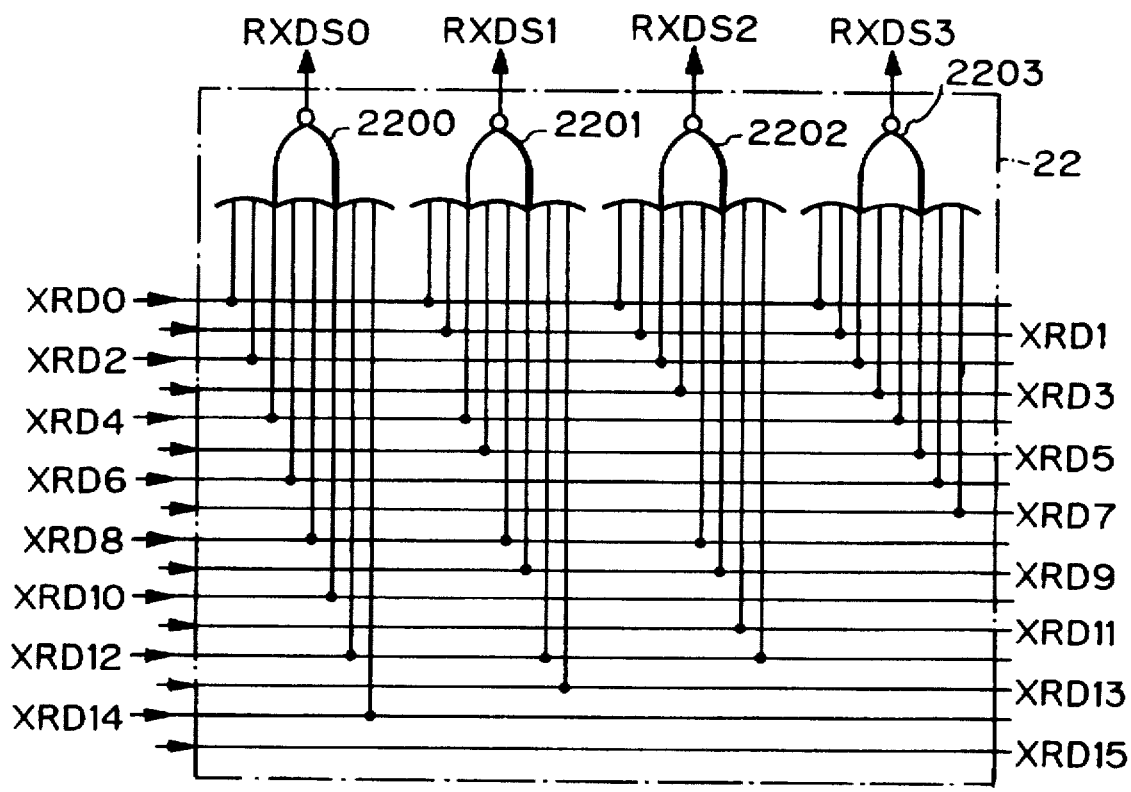
FIG. 13A is a circuit diagram of the redundant row encoder of FIG. 12.
FIG. 13B is a table showing a relationship between the inputs and outputs of the redundant row encoder of FIG. 13A.

The redundant row encoder 22 encodes the sixteen redundant selection signals XRD0, XRD1, . . . , XRD15 into a four-bit redundant row encode signal RXDS including four bits RXDS0, RXDS1, RXDS2 and RXDS3. The redundant row encoder 22 is illustrated in FIG. 13A. That is, the redundant row encoder 22 is formed by two NOR circuits 2200, 2201, 2202 and 2203. The redundant selection signals XRD0, XRD2, . . . , XRD14 are supplied to the NOR circuit 2200 to generate the redundant row encode signal RXDS0. Also, the redundant selection signals XRD0, MRD1, XRD4, . . . , XRD13 are supplied to the NOR circuit 2201 to generate the redundant row encode signal RXDS1. Further, the redundant selection signals XRD0, XRD2 XR3, . . . , XRD13 are supplied to the NOR circuit 2202 to generate the redundant row encode signal RXDS2. In addition, the redundant selection signals XRD0, XRD1, XRD2, . . . , XRD7 are supplied to the NOR circuit 2203 to generate the redundant row encode signal RXDS3.

In the redundant row encoder 22, the relationships between the inputs and the outputs are shown in FIG. 13B.

Two bits of the redundant row encode signal RXDS are supplied to the block control circuits 7"-0, 7"-1, 7"-2 and 7"-3 to generate one of the redundant row selection signals RXDS0, RXDS1, RXDS2 and RXDS3, thus selecting one of the redundant memory cell arrays 2'-0, 2'-1, 2'-2 and 2'-3. On the other hand, the other two bits of the redundant row encode signal RXDS are supplied to the redundant row decoder/driver circuits 10"-0, 10"-1, 10"-2 and 10"-3 to select one of the redundant word lines RWL0, RWL1, RWL2 and RWL3 within the selected redundant memory cell array. For example, the bits RXDS0 and RXDS1 are supplied to the block control circuits 7"-0, 7"-1, 7"-2 and 7"-3, while the bits RXDS2 and RXDS3 are supplied to the redundant row decoder/driver circuits 10"-0, 10"-1, 10"-2 and 10"-3.

Generally, the redundant row encoder 22 can be constructed to encode a $2^n$-bit input signal to an n-bit output signal (in FIG. 12, n=4).

Figure 14:
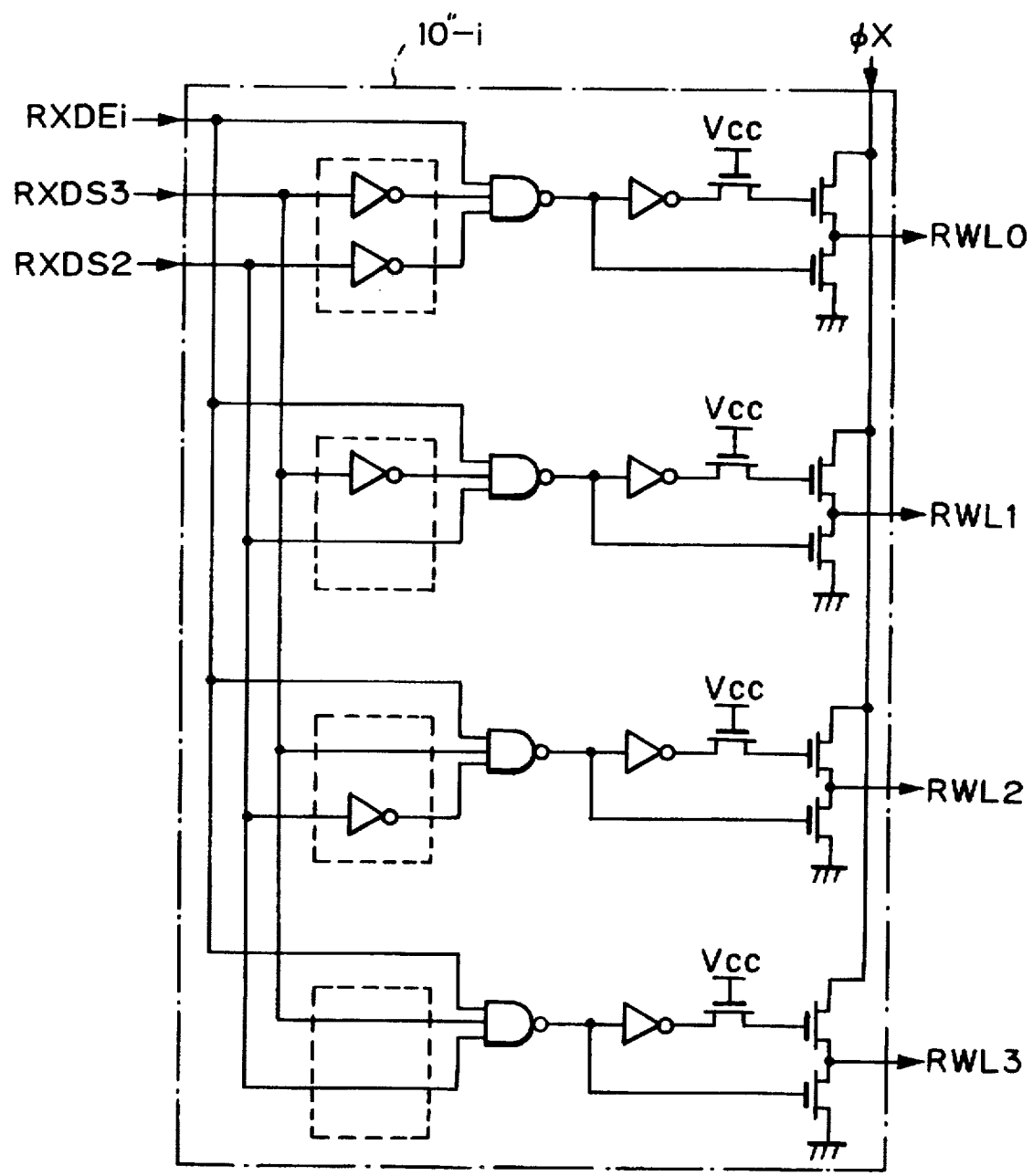
FIG. 14 is a circuit diagram of the redundant row decoder/driver circuit of FIG. 12.

The block control circuits 7"-0, 7"-1, 7"-2 and 7"-3 have the same configuration as those of FIGS. 11A, 11B, 11C and 11D. In this case, the redundant row decoder/driver circuit 10"-i (i=0, 1, 2, 3) is illustrated in FIG. 14. In FIG. 14, the presence of inverters corresponds to the low level logic of the redundant row encode signals RXDS2 and RXDS3 of FIG. 13B.

In FIG. 12, although selection of one of the redundant word lines RWL0, RWL1, RWL2 and RWL3 is carried out by two stages, i.e., the block control circuit 7"-0, 7"-1, 7"-2 and 7"-3 and the redundant row decoder/driver circuits 10"-0, 10"-1, 10"-2 and 10"-3, this selection can be carried out by one stage.

In FIG. 12, when the replacement determination signal XRDN is high (inactive) and the block selection signal BSLi is high (active), the block control circuit 7"-i generates a row decoder activation signal XDCEi for the row decoder/driver circuit 8-i and a sense amplifier activation signal SAEi for the sense amplifier circuit 9-i. In this case, a redundant row selection signal RXDEi is not generated. On the other hand, when the replacement determination signal XRDN is low (active), i.e., when one of the redundant selection signals XRD0 through, XRD15 is high (active), the block control circuit 7"-i deactivates the row decoder activation signal XDCEi. In this case, when the redundant selection signal XRDi is high (active), the outputs of the decoder of the block control circuit 7"-i are both high, so that the sense amplifier activation signal SAEi for the sense amplifier circuit 9-i and the redundant row selection signal RXDEi for the redundant memory cell array 2-i are activated.

Thus, in the semiconductor memory device of FIG. 12, since only four lines for the redundant row encode signals RXDS0, RXDS1, RXDS2 and RXDS3 are connected between the redundant row encoder 22 and the block control circuits 7"-0, 7"-1, 7"-2 and 7"-3 (the redundant row decoder/driver circuits 10"-0, 10"-1, 10"-2 and 10"-3), the integration can be enhanced as compared with the semiconductor memory device of FIG. 4. Note that if the devices of FIGS. 4 and 12, have $2^n$ rows of redundant memory cells, the number of lines between the redundant row decoders (the redundant row encoder) and the block control circuits can be reduced from $2^n$ to n. Therefore, when the value n is larger, the integration can be further enhanced.

Figure 15:
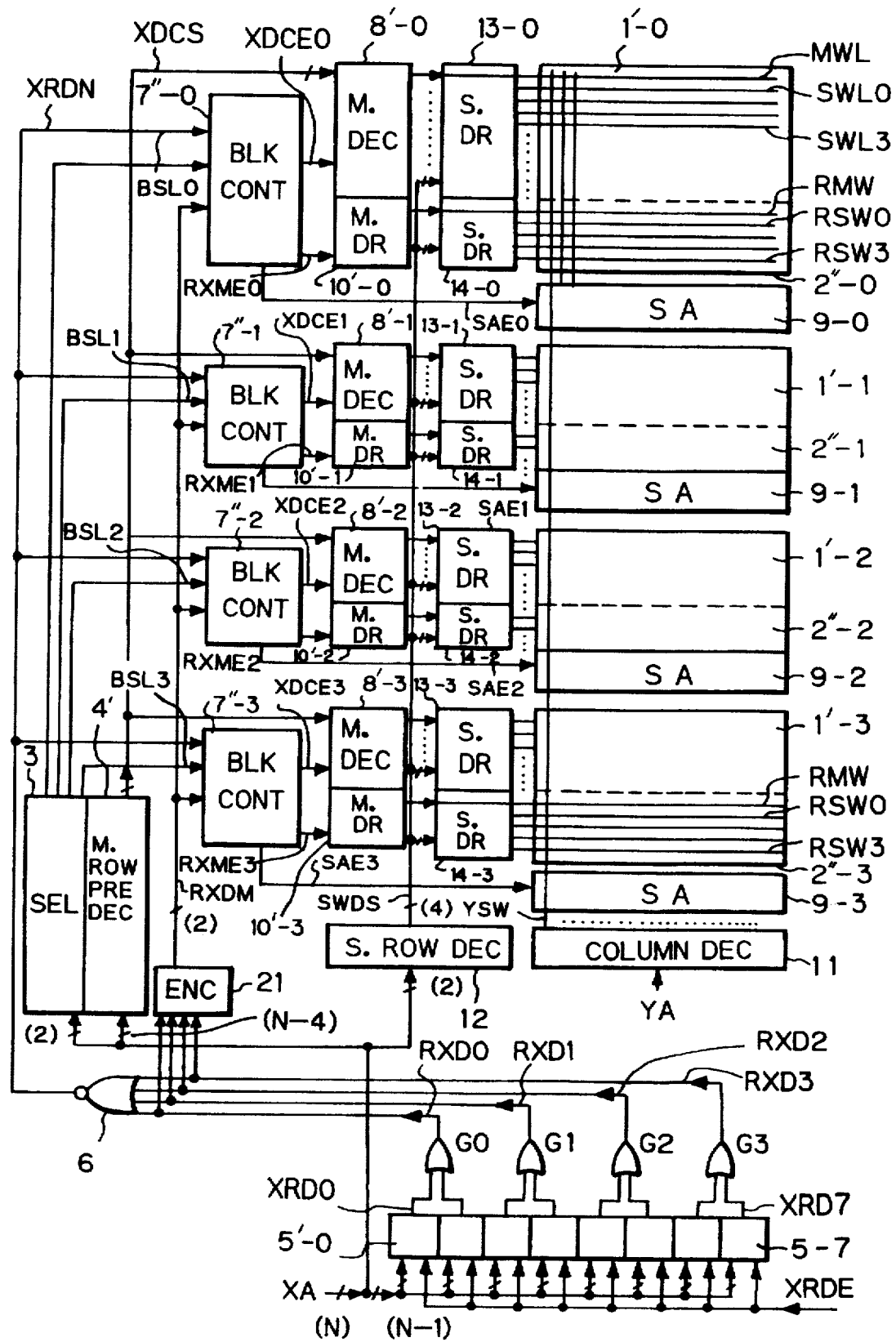
FIG. 15 is a block circuit diagram illustrating a third embodiment of the semiconductor memory device according to the present invention.

In FIG. 15, which illustrates a third embodiment of the present invention, the first embodiment of FIG. 9 is applied to the semiconductor memory device of FIG. 6. That is, a redundant row encoder 21 is added to the elements of FIG. 6, and the block control circuits 7-0, 7-1, 7-2 and 7-3 of FIG. 6 are modified into block control circuits 7"-0, 7"-1, 7"-2 and 7"-3, respectively. Note that the details of the row redundant row encoder 21 are illustrated in FIGS. 10A and 10B, and the detail of the block control circuits 7"-0, 7"-1, 7"-2 and 7"-3 are illustrated in FIGS. 11A, 11B, 11C and 11D, respectively. In this case, however, redundant main row encode signals RXDM0 and RXDM1 are used instead of the redundant row encode signals RXDS0 and RXDS1, and redundant main row activation signals RXME0, RXME1, RXME2 and RXME3, are used instead of the redundant main row selection signals RXD1, RXD1, RXD2 and RXD3.

Thus, in the semiconductor memory device of FIG. 15, since only two lines for the redundant row encode signals RXDM0 and RXDM1 are connected between the redundant row encoder 21 and the block control circuits 7"-0, 7"-1, 7"-2 and 7"-3 the integration can be enhanced as compared with the semiconductor memory device of FIG. 6. Note that if the devices of FIGS. 6 and 15, have $2^n$ rows of redundant memory cells, the number of lines between the redundant row decoders (the redundant row encoder) and the block control circuits can be reduced from $2^n$ to n. Therefore, when the value n is larger, the integration can be further enhanced.

Figure 16:
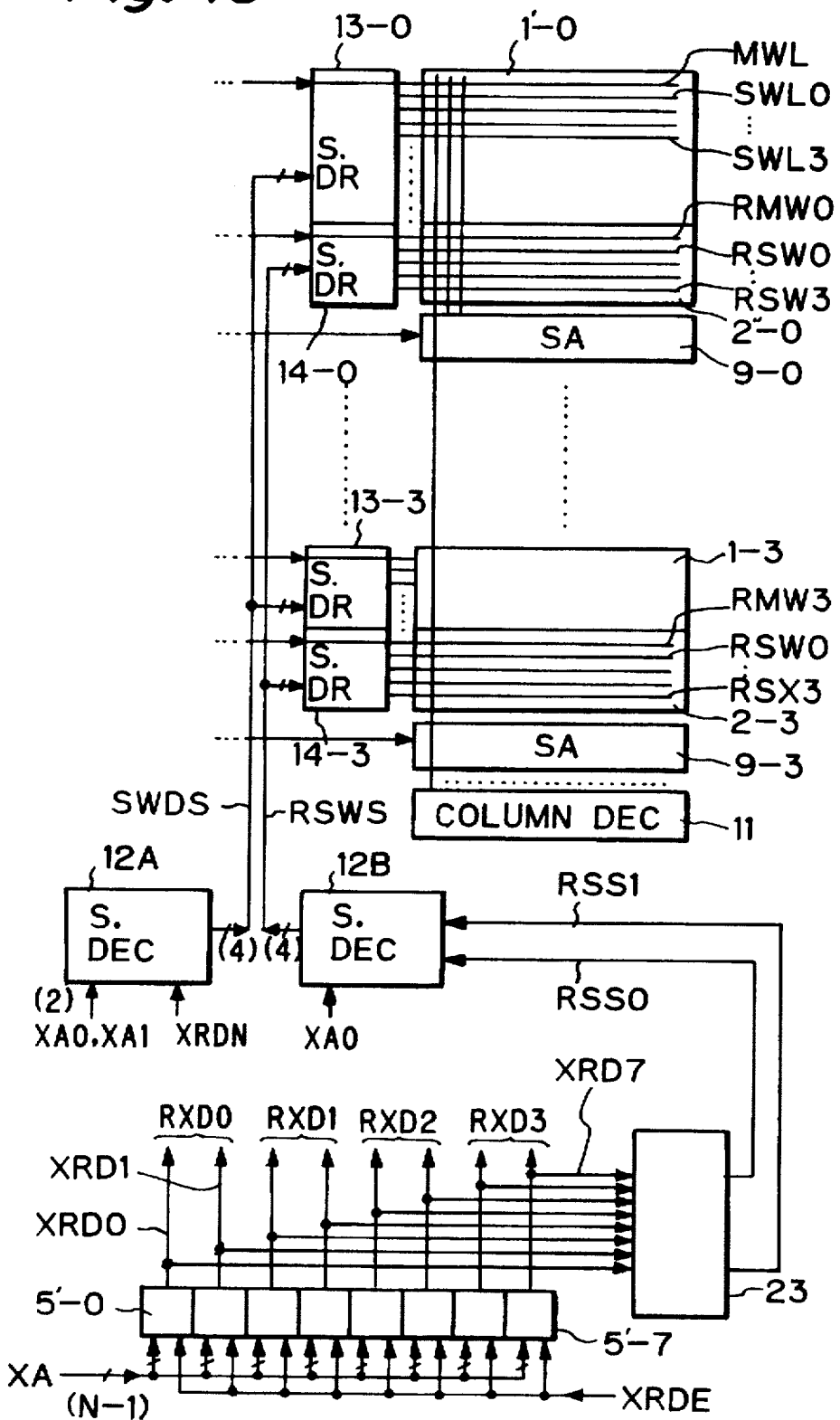
FIG. 16 is a block circuit diagram illustrating a fourth embodiment of the semiconductor memory device according to the present invention.

In FIG. 16, which illustrates a fourth embodiment of the present invention, a sub row decoder 12A and a redundant sub decoder 12B are provided instead of the sub row decoder 12 of FIG. 6. That is, the sub row decoder 12A is used only for selecting one sub word line within a selected memory cell block, and the redundant sub row decoder 12B is used only for selecting redundant sub word line within a selected redundant memory cell array.

In more detail, the sub row decoder 12A is activated by the high (inactive) level of the replacement determination signal XRDN to select one of the sub word lines SWL0, SWL1, SWL2 and SWL3 in accordance with the lower bits XA0 and XA1 of the row address signal XA.

The redundant sub row decoder 12A is operated with a redundant sub word line group selecting circuit 23. The redundant sub word line group selecting circuit 23 is operated to select a first group of redundant sub word line such as RSW0 and RSW1 or a second group of redundant sub word line such as RSW2 and RSW3 in accordance with the redundant selection signals XRD0 to XRD7. In addition, one redundant sub word line group is selected in accordance with the least significant bit XA0 of the row address signal XA.

Figures 17A, 17B:
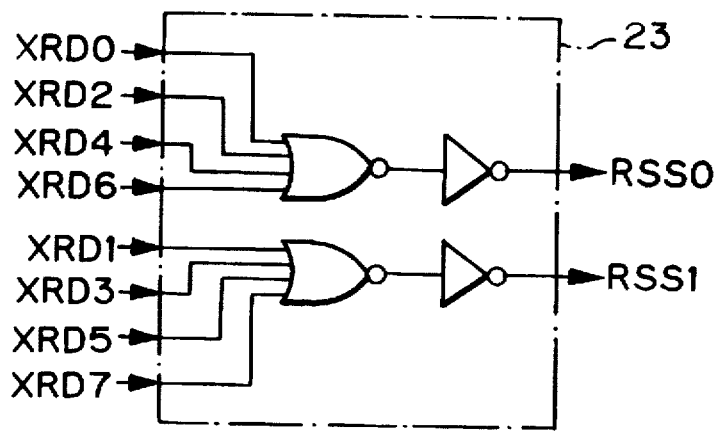
FIG. 17A is a circuit diagram of the redundant sub word line group selecting circuit of FIG. 16.
FIG. 17B is a table showing a relationship between the inputs and outputs of the redundant sub word line group selecting of FIG. 16A.

The redundant sub word line group selecting circuit 23 is illustrated in FIG. 17A, and the relationship between the inputs and outputs of the redundant sub word line group selecting circuit 23 is shown in FIG. 17B.

In the fourth embodiment, in the same way as in FIG. 6, the redundant row decoders 5'-0 to 5'-7 do not receive the least significant bit XA0 of the row address signal XA. Therefore, each of the redundant row decoders 5'-0 to 5'-7 corresponds to two redundant word lines such as RSW0 and RSW1 or RSW2 and RSW3, which can be discrimated from each other by the least significant bit XA0 (=high or low). In this case, since redundant sub row selection signals RSWS0, RSWS1, RSWS2 and RSWS3 generated from the redundant sub row decoder 12B are independent of sub row selection signals SWDS0, SWDS1, SWDS2 and SWDS3 generated from the sub row decoder 12A, selection of the two redundant sub word lines RSW0 and RSW1 and the two redundant sub word lines RSW2 and RSW3 is independent of selection of the sub word lines SWL0 and SWL1 and the sub word lines SWL2 and SWL3.

Figure 18A:
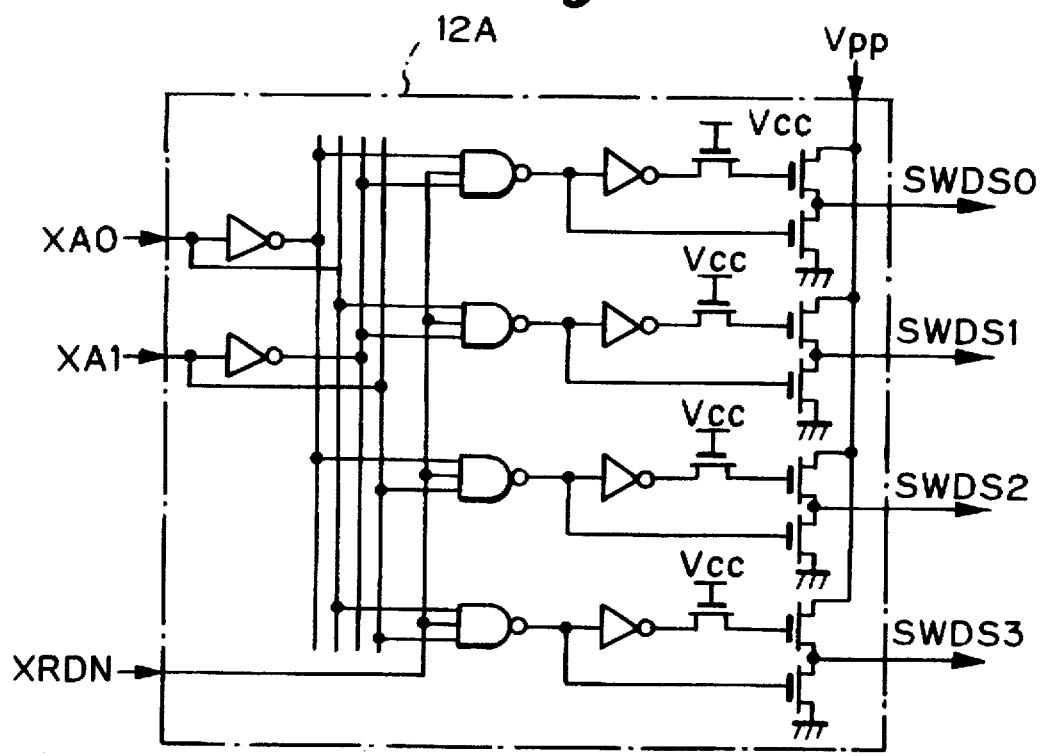
FIG. 18A is a circuit diagram of the sub row decoder of FIG. 16.
Figure 18B:
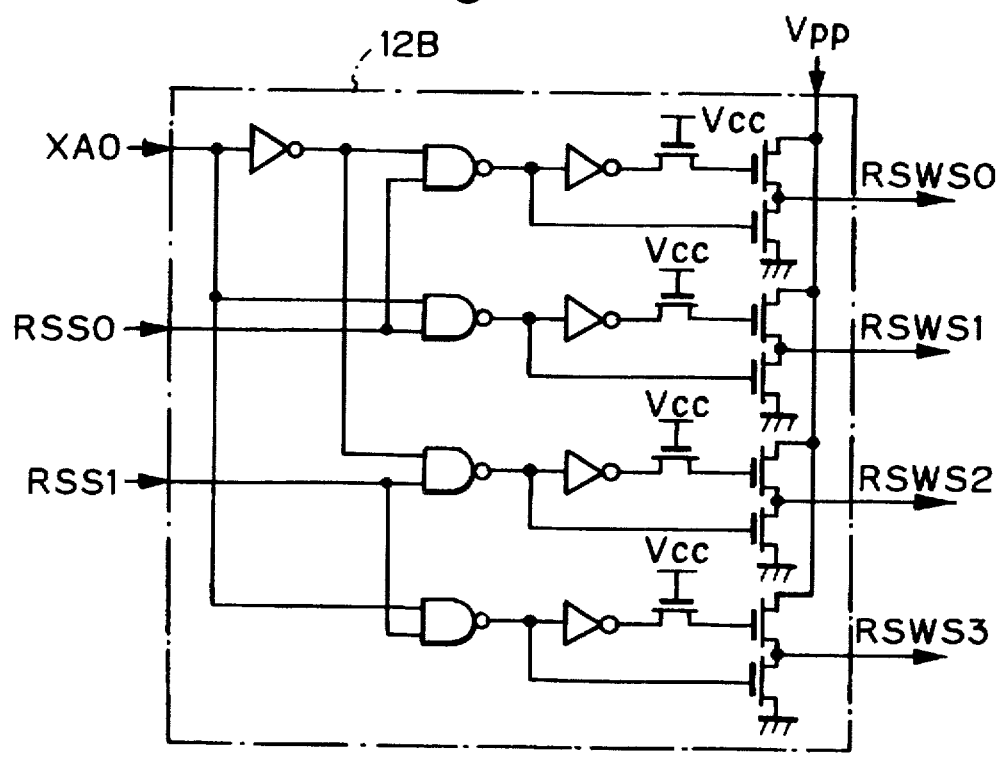
FIG. 18B is a circuit diagram of the redundant sub row decoder of FIG. 16.

The sub row decoder 12A and the redundant row decoder 12B are illustrated in FIGS. 18A and 18B, respectively.

Thus, in the semiconductor memory device of FIG. 16, since one group of word lines can be replaced by any group of redundant word lines, the freedom of replacement can be twice that compared with the device of FIG. 6, which enhances the manufacturing yield.

Figure 19:
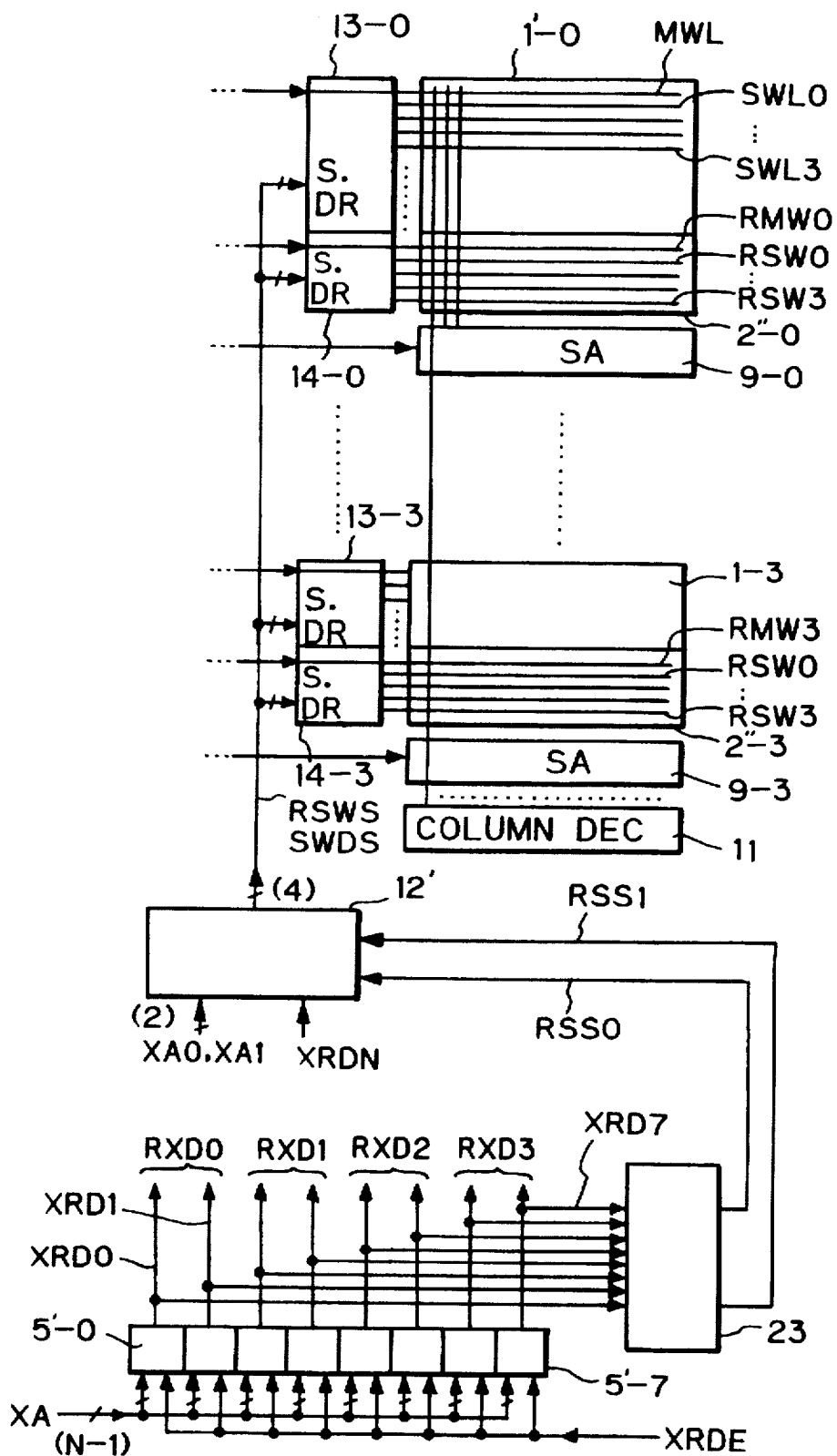
FIG. 19 is a block circuit diagram illustrating a fifth embodiment of the semiconductor memory device according to the present invention.

In FIG. 19, which illustrates a fifth embodiment of the present invention, the sub row decoder 12A and the redundant sub row decoder 12B of FIG. 16 are combined into a single sub row decoder/redundant sub row decoder circuit 12', so that the sub row selection signals SWDS0, SWDS1, SWDS2 and SWDS3 and the redundant sub row selection signals RSWS0, RSWS1, RSWS2 and RSWS3 are generated from the same output terminals.

Figure 20:
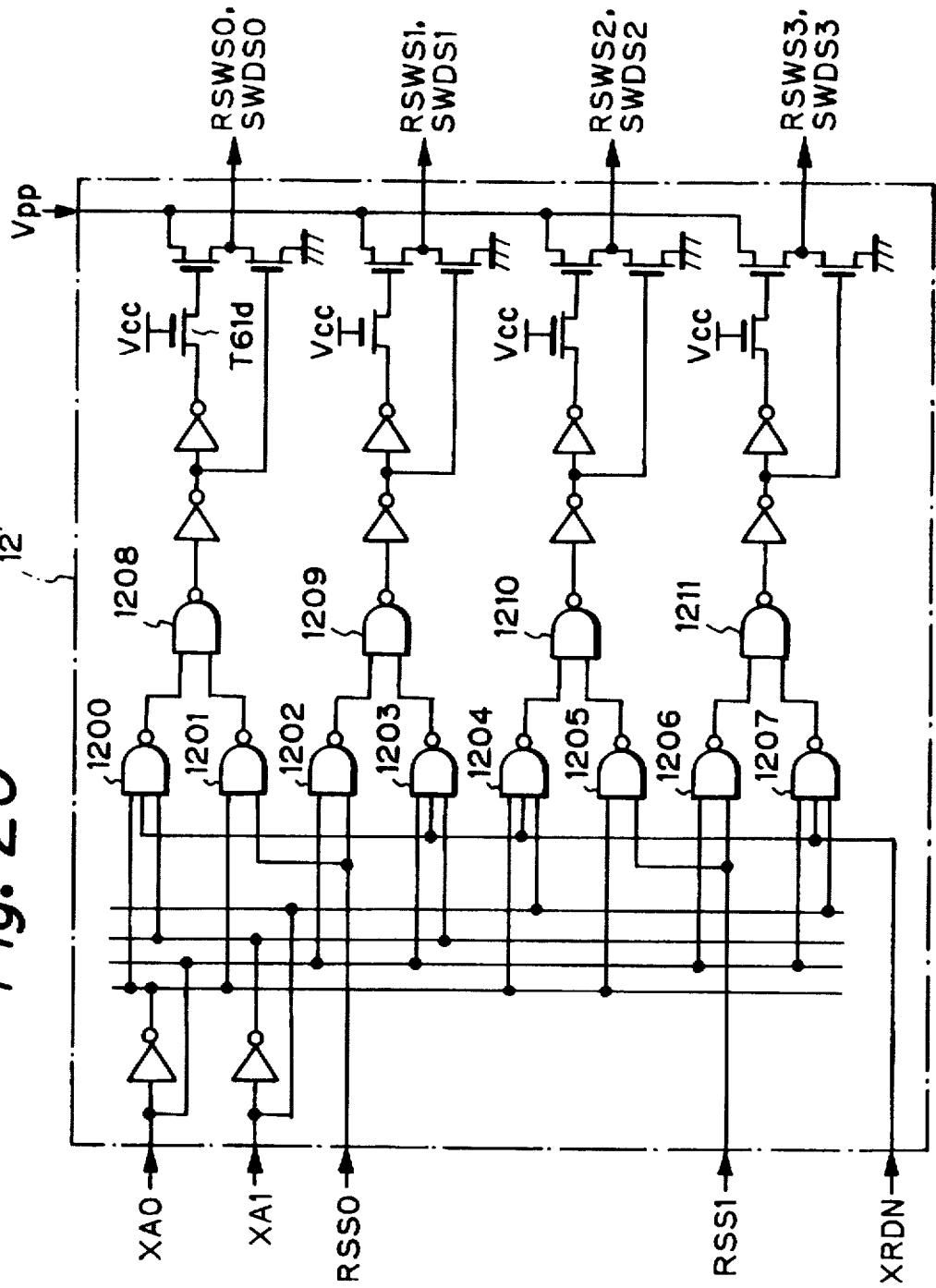
FIG. 20 is a circuit diagram of the sub row decoder/redundant sub decoder circuit of FIG. 19.

The circuit 12' is illustrated in FIG. 20. That is, NAND circuits 1200 through 1207 are provided to receive the lower bits XA0 and XA1 of the row address signals XA, the redundant sub word line group selection signals RSS0 and RSS1, and the replacement determination signal XRDN. Also, the NAND circuits 1200 and 1201 are connected to a NAND circuit 1208 for generating the signals RSWS0 and SWDS0; the NAND circuits 1202 and 1203 are connected to a NAND circuit 1209 for generating the signals RSWS1 and SWDS1; the NAND circuits 1204 and 1205 are connected to a NAND circuit 1210 for generating the signals RSWS2 and SWDS2; and the NAND circuits 1206 and 1207 are connected to a NAND circuit 1211 for generating the signals RSWS3 and SWDS3.

When the replacement determination signal XRDN is high (inactive), all the redundant selection signals XRD0, XRD1, ..., XRD7 are low, so that the redundant sub word line group selection signals RSS0 and RSS1 are both low. Therefore, the outputs of the NAND circuits 1201, 1202, 1205 and 1206 are high. On the other hand, the output of one of the NAND circuits 1200, 1203, 1204 and 1207 is low in accordance with the lower bits XA0 and XA1 of the row address signal XA. As a result, the output of one of the NAND circuits 1208, 1209, 1210 and 1211 is high, thus generating one of the sub row selection signals SWDS0, SWDS1, SWDS2 and SWDS3. Thus, one sub word line SWL0, SWL1, SWL2 or SWL3 is selected within a memory cell block selected by the main row decoders 8'-0, 8'-1, 8'-2 and 8'-3. Note that, even when the sub row selection signal SWDS0, SWDS1, SWDS2 or SWDS3 is supplied as a redundant sub row selection signal to the redundant sub row driver circuit 14-0, 14-1, 14-2 or 14-3, a redundant sub word line is never selected, since the redundant main row selection signals RXD0, RXD1, RXD2 and RXD3 are all low (inactive).

When the replacement determination signal XRDN is low (active), the outputs of the NAND circuits 1200, 1203, 1204 and 1207 are high. On the other hand, the output of one of the NAND circuits 1201, 1202, 1205 and 1206 is low in accordance with the redundant sub word line group selection signals RSS0 and RSS1 and the lower bits XA0 and XA1 of the row address signal XA. As a result, the output of one of the NAND circuits 1208, 1209, 1210 and 1211 is high, thus generating one of the redundant sub row selection signals RSWS0, RSWS1, RSWS2 and RSWS3. Thus, one redundant sub word line RSW0, RSW1, RSW2 or RSW3 is selected within a redundant memory cell array selected by the redundant main row decoders 10'-0, 10'-1, 10'-2 and 10'-3. Note that, even when the redundant sub row selection signal RSWS0, RSWS1, RSWS2 or RSWS3 is supplied as a sub row selection signal to the sub row driver circuit 13-0, 13-1, 13-2 or 13-3, a sub word line is never selected, since the main decoder activation signals XDCE0, XDCE1, XDCE2 and XDCE3 are all inactive by the replacement determination signal XRDN.

Thus, in the semiconductor memory device of FIG. 19, since only four lines for the signals RSWS0, RSWS1, RSWS2, RSWS3, SWDS0, SWDS1, SWDS2 and SWDS3 are connected between the sub row decoder/redundant sub row decoder circuit 12' and the sub row driver circuits 13-0, 13-1, 13-2 and 13-3 (the redundant sub row driver circuits 14-0, 14-1, 14-2 and 14-3), the integration can be enhanced as compared with the device of FIG. 16.

Figure 21:
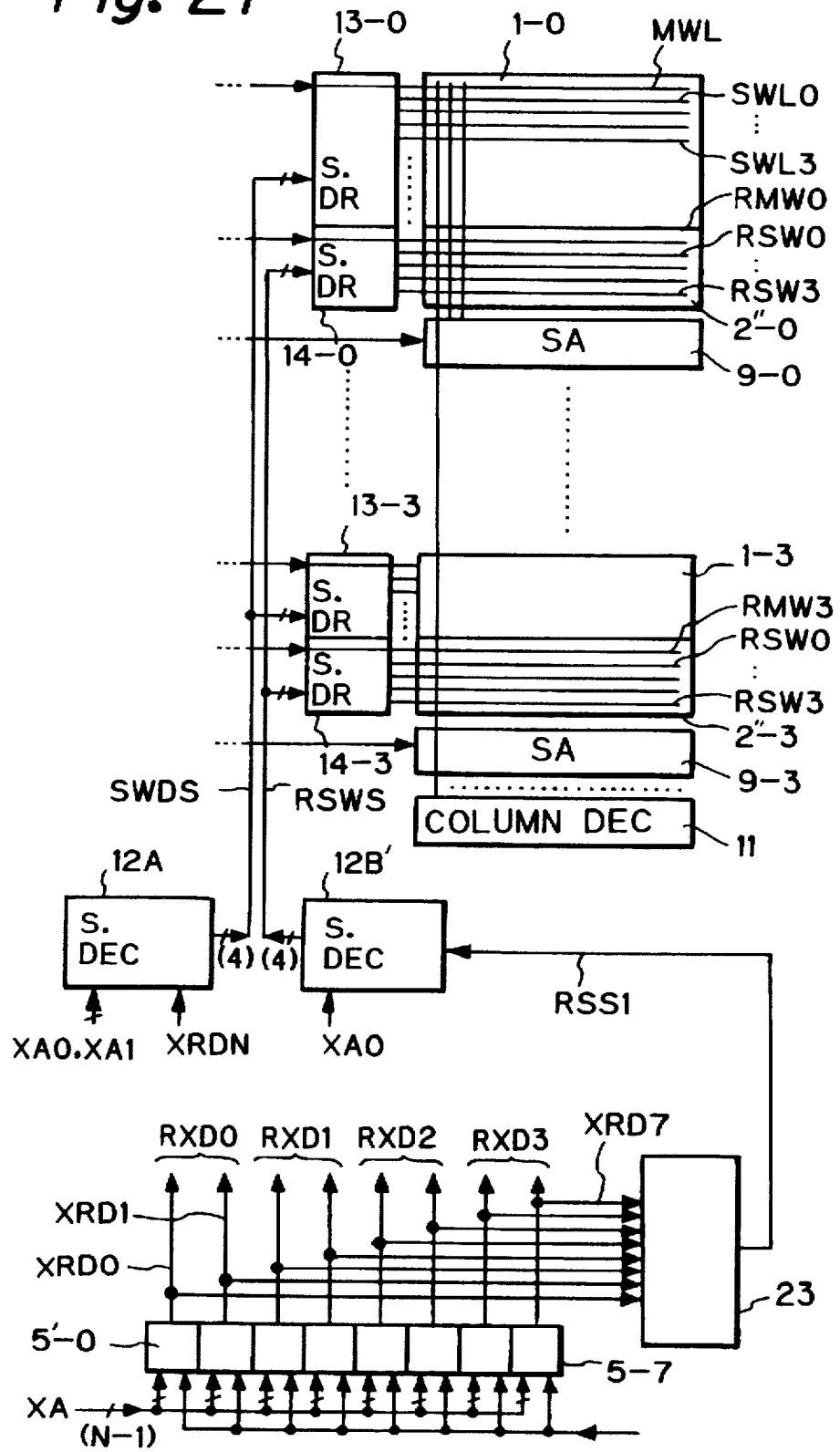
FIG. 21 is a block circuit diagram illustrating a sixth embodiment of the semiconductor memory device according to the present invention.

In FIG. 21, which illustrates a sixth embodiment of the present invention, a redundant sub word line group selecting circuit 23' is provided instead of the redundant sub word line group selecting circuit 23 of FIG. 16. The redundant sub word line group selecting circuit 23' generates only one redundant word line group selection signal RSS1. Also, the redundant sub row decoder 12B of FIG. 16 is modified into a redundant sub row decoder 12B'.

Figures 22A, 22B:
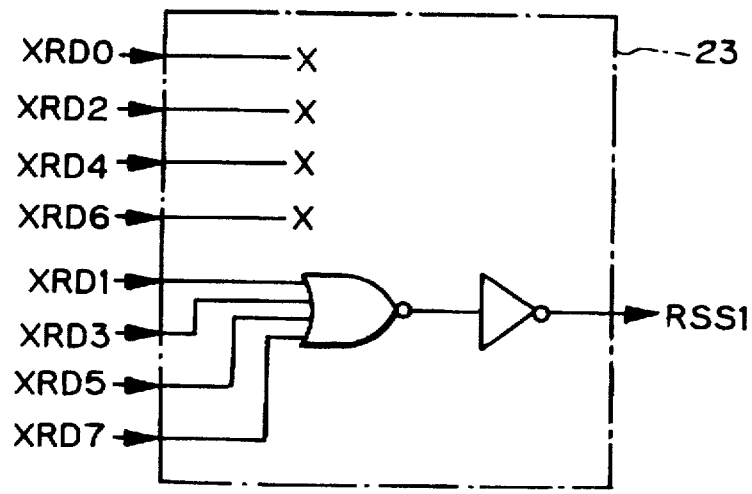
FIG. 22A is a circuit diagram of the redundant word line group selecting circuit of FIG. 21.
FIG. 22B is a table showing a relationship between the inputs and outputs of the redundant word line group selecting circuit of FIG. 22A.

The redundant sub word line group selecting circuit 23' is illustrated in FIG. 22A, and the relationships between the inputs and outputs of the redundant sub word line group selecting circuit 23' is shown in FIG. 22B. Also, the redundant sub row decoder 12B' is illustrated in FIG. 23.

As illustrated in FIGS. 22A and 22B, when all the redundant selection signals XRD0, XRD1, ..., XRD7 are low, the redundant word line group selection signal RSS1 is low. Also, when one of the redundant selection signals XRD0, XRD2, XRD4 and XRD6 is high, the redundant word line group selection signal RSS1 is low. The two cases can be discriminated from each other by the replacement determination signal XRDN.

Generally, in FIG. 21, if (N-x) bits of the N-bit row address signal XA are supplied to the redundant row decoder 5'-0 through 5'-7 and each of the redundant memory cell arrays 2''-0, 2''-1, 2''-2, and 2'-3 has $2^y$ redundant sub word lines (y>x), each of the redundant raw decoders 5'-0; 5'-1, ..., 5'-7 corresponds to $2^x$ redundant sub word lines, and there are (y-x) groups of redundant sub word lines within each of the redundant memory cell arrays 2''-0, 2''-1, 2''-2, and 2''-3 That is, in FIG. 21, y=2 and x=1, then, the eight redundant selection signals XRD0, XRD1, ..., XRD7 is converted by the redundant sub word line group selecting circuit 23' into one redundant sub row group selection signal.

Figure 23:
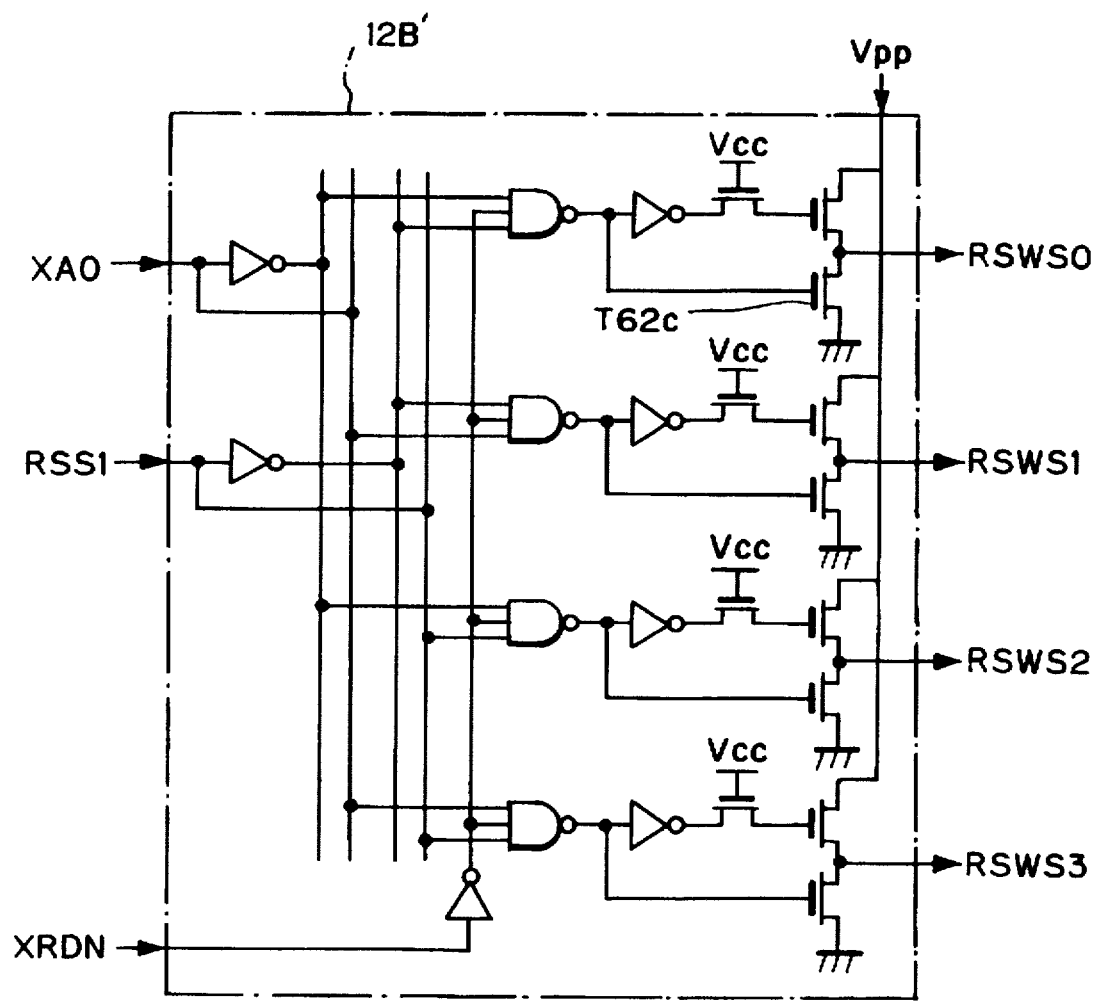
FIG. 23 is a circuit diagram of the redundant sub row decoder of FIG. 21.

In FIG. 23, when the replacement determination signal XRDN is high (inactive), all the redundant sub row selection signals RSWS0, RSWS1, RSWS2 and RSWS3 are low (inactive). On the other hand, when the replacement determination signal XRDN is low (active), the redundant sub word line group selection signal RSS1 and the least significant bit XA0 of the row address signal XA are decoded to activate one of the redundant sub word line group selection signals RSWS0, RSWS1, RSWS2 and RSWS3.

Thus, in the semiconductor memory device of FIG. 21, since only one line for the signal RSS1 is connected between the redundant sub word line group selection circuit 23' and the redundant sub row decoder 12B', the integration can be enhanced as compared with the device of FIG. 16

Figure 24:
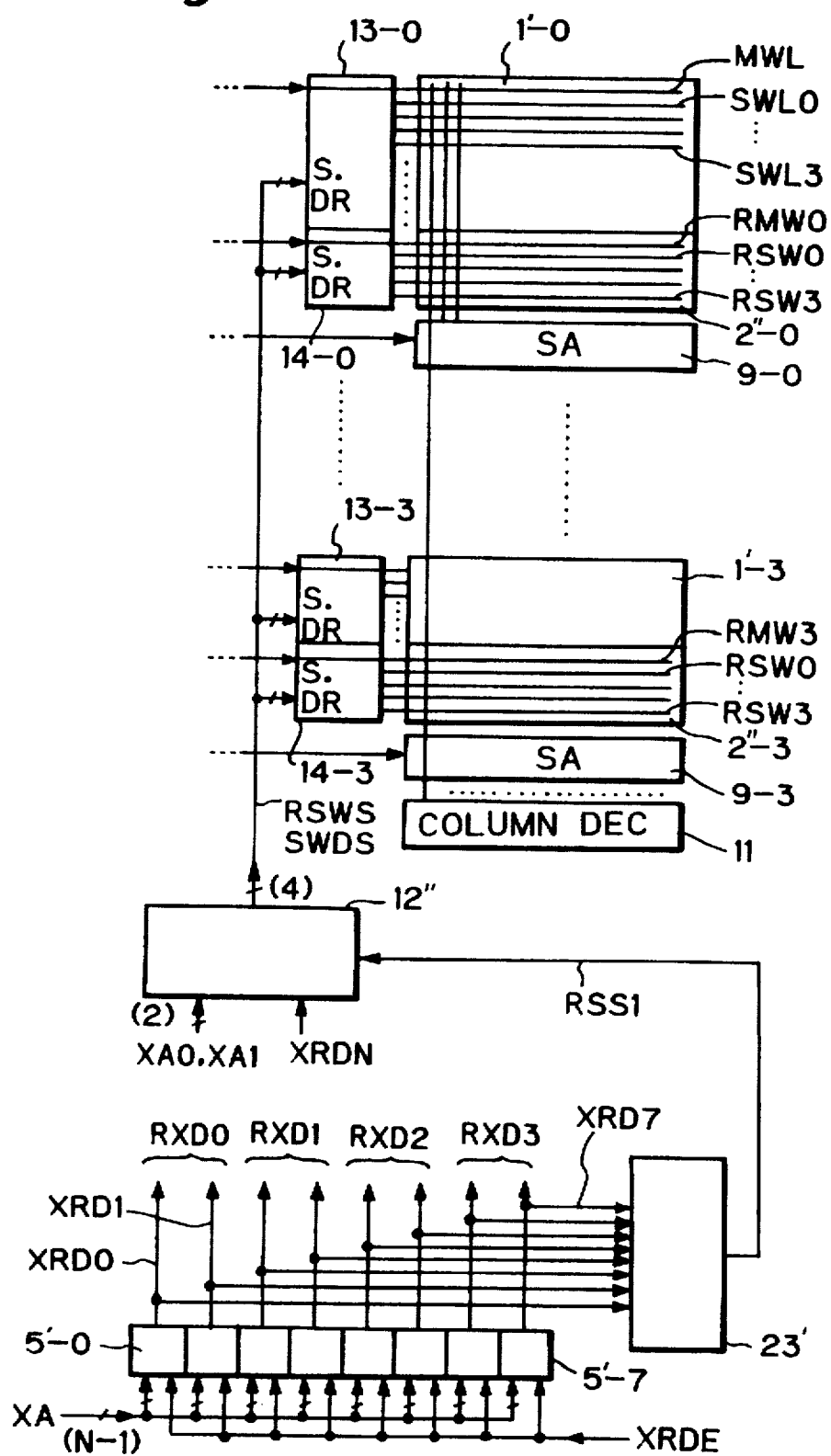
FIG. 24 is a block circuit diagram illustrating a seventh embodiment of the semiconductor memory device according to the present invention.

In FIG. 24, which illustrates a seventh embodiment of the present invention, the sub row decoder 12A and the redundant sub row decoder 12B', of FIG. 21 are combined into a single sub row decoder/redundant sub row decoder circuit 12'', so that the sub row selection signals SWDS0, SWDS1, SWDS2 and SWDS3 and the redundant sub row selection signals RSWS0, RSWS1, RSWS2 and RSWS3 are generated from the same output terminals.

Figure 25:
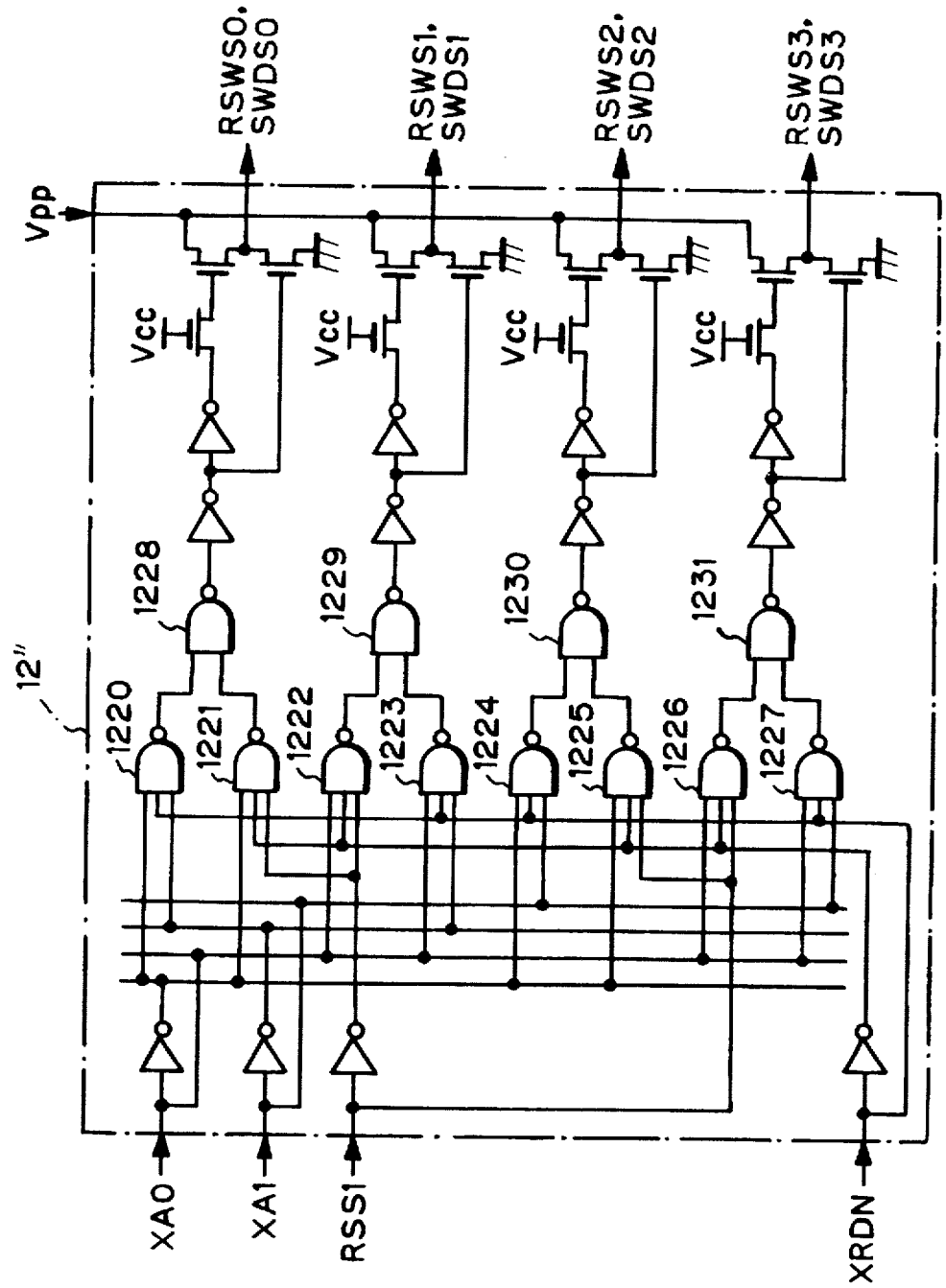
FIG. 25 is a circuit diagram of the sub row decoder/redundant sub decoder circuit of FIG. 24.

The circuit 12'' is illustrated in FIG. 25. That is NAND circuits 1220 through 1227 are provided to receive the lower bits XA0 and XA1 of the row address signals XA, the redundant sub word line group selection signal RSS1, and the replacement determination signal XRDN. Also, the NAND circuits 1220 and 1221 are connected to a NAND circuit 1228 for generating the signals RSWS0 and SWDS0; the NAND circuits 1222 and 1223 are connected to a NAND circuit 1229 for generating the signals RSWS1 and SWDS1; the NAND circuits 1224 and 1225 are connected to a NAN circuit 1230 for generating the signals RSWS2 and SWDS2; and the NAND circuits 1226 and 1227 are connected to a NAND circuit 1231 for generating the signals RSWS3 and SWDS3.

When the replacement determination signal XRDN is high (inactive), all the redundant selection signals XRD0, XRD1, . . . , XRD7 are low, so that the redundant sub word line group selection signal RSS1 is low. Therefore, the outputs of the NAND circuits 1221, 1222, 1225 and 1226 are high. On the other hand, the output of one of the NAND circuits 1220, 1223, 1224 and 1227 is low in accordance with the lower bits XA0 and XA1 of the row address signal XA. As a result, the output of one of the NAND circuits 1228, 1229, 1230 and 1231 is high, thus generating one of the sub row selection signals SWDS0, SWDS1, SWDS2 and SWDS3. Thus, one sub word line SWL0, SWL1, SWL2 or SWL3 is selected within a memory cell block selected by the main row decoders 8'-0, 8'-1, 8'-2 and 8'-3. Note that, even when the sub row selection signal SWDS0, SWDS1, SWDS2 or SWDS3 is supplied as a redundant sub row selection signal to the redundant sub row driver circuit 14-0, 14-1, 14-2 or 14-3, a redundant sub word line is never selected, since the redundant main row selection signals RXD0, RXD1, RXD2 and RXD3 are all low (inactive).

When the replacement determination signal XRDN is low (active), the outputs of the NAND circuits 1220, 1223, 1224 and 1227 are high. On the other hand, the output of one of the NAND circuits 1221, 1222, 1225 and 1226 is low in accordance with the redundant sub word line group selection signal RSS1 and the lower bits XA0 and XA1 of the row address signal XA. As a result, the output of one of the NAND circuits 1228, 1229, 1230 and 1231 is high, thus generating one of the redundant sub row selection signals RSWS0, RSWS1, RSWS2 and RSWS3. Thus, one redundant sub word line RSW0, RSW1, RSW2 or RSW3 is selected within a redundant memory cell array selected by the redundant main row decoders 10'-0, 10'-1, 10'-2 and 10'-3. Note that, even when the redundant sub row selection signal RSWS0, RSWS1, RSWS2 or RSWS3 is supplied as a sub row selection signal to the sub row driver circuit 13-0, 13-1, 13-2 or 13-3, a sub word line is never selected, since the main decoder activation signals DCE0, DCE1, DCE2 and DCE3 are all made inactive by the replacement determination signal XRDN.

Thus, in the semiconductor memory device of FIG. 24, since only four lines for the signals RSWS0, RSWS1, RSWS2, RSWS3, SWDS0, SWDS1, SWDS2 and SWDS3 are connected between the sub row decoder/redundant sub row decoder circuit 12" and the sub row driver circuits 13-0, 13-1, 13-2 and 13-3 (the redundant sub row driver circuits 14-0, 14-1, 14-2 and 14-3), the integration can be enhanced as compared with the device of FIG. 21.

Figure 26:
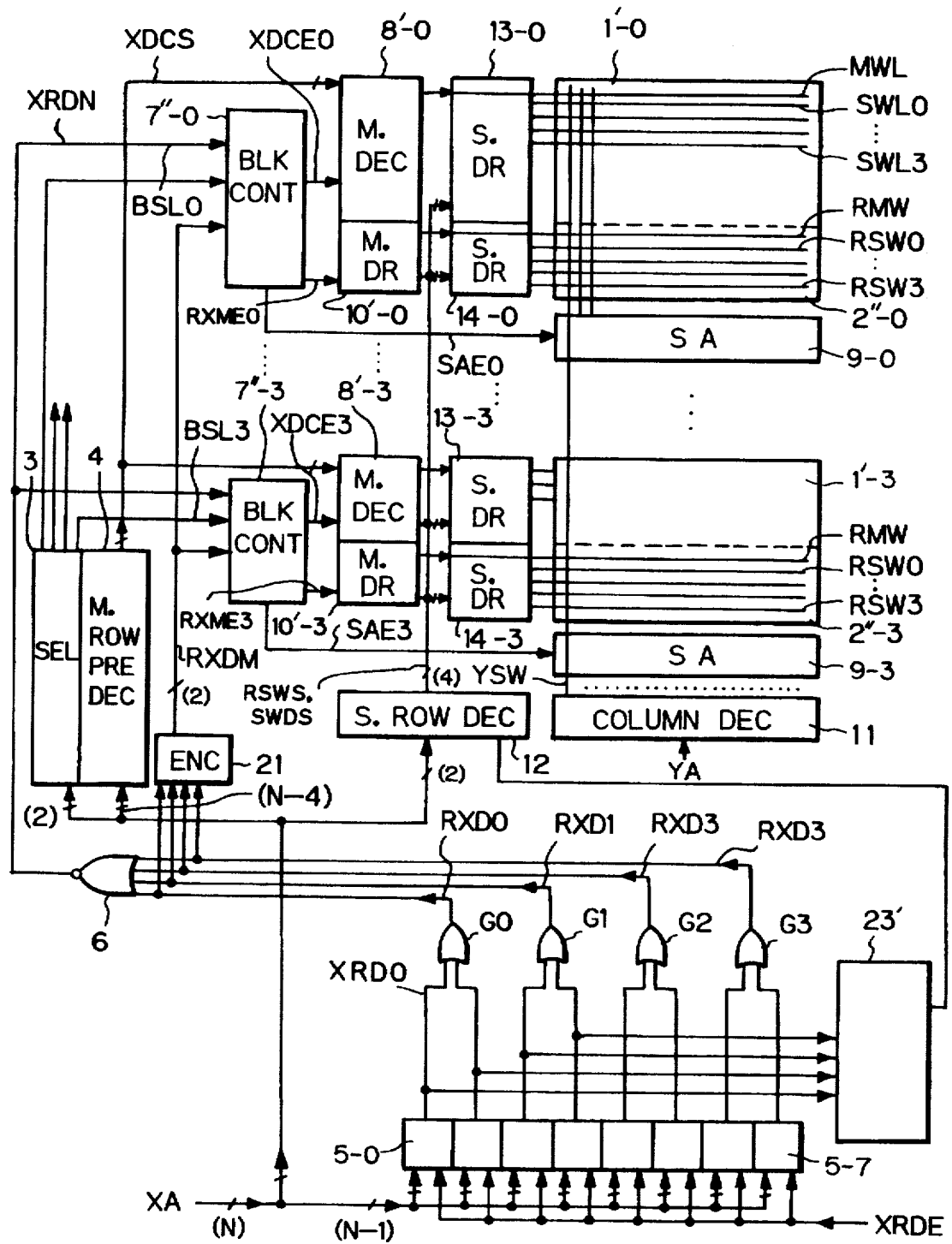
FIG. 26 is a block circuit diagram illustrating an eighth embodiment of the semiconductor memory device according to the present invention.

In FIG. 26, which illustrates an eighth embodiment of the present invention, the third embodiment as illustrated in FIG. 15 is combined with the seventh embodiment as illustrated in FIG. 24. Thus, the as integration can be enhanced, and simultaneously, the freedom of replacement can be enhanced.

Note that, it is possible to combine the third embodiment as illustrated in FIG. 15 with the embodiment as illustrated in FIG. 16. Forther, the third embodiment can be combined with the fourth or sixth embodiment.

Figure 27:
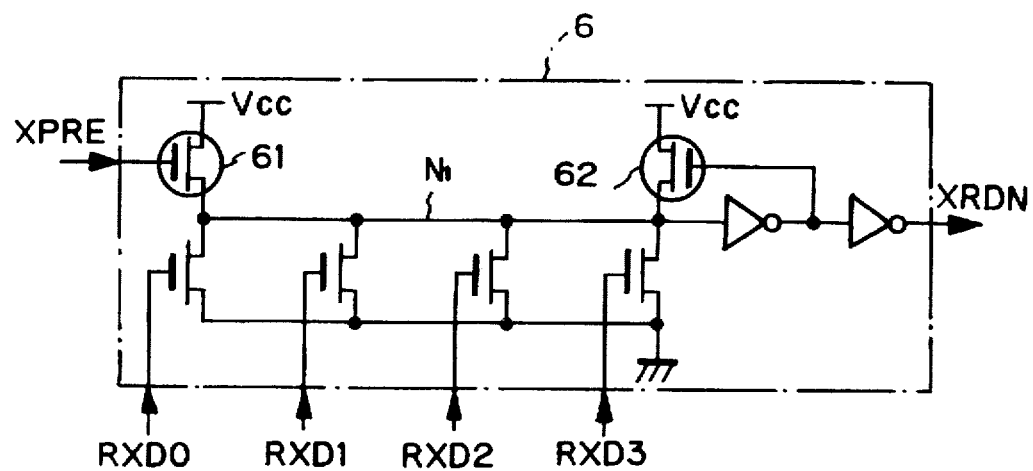
FIG. 27 is a circuit diagram of the replacement determination circuit of FIGS. 9, 12, 15, 16, 19, 21, 24 and 26.

The replacement determination circuit 6 of FIGS. 9, 12, 15, 16, 19, 21, 24 and 26 can be formed by a wired logic circuit as illustrated in FIG. 27. In FIG. 27, before a row selecting operation, a precharge signal XPRE is made low to turn ON a P-channel MOS transistor 61, so that a node $N_1$ is precharged. Then, the precharge signal XPRE is made high to turn OFF the transistor 61, so that precharging of the node $N_1$ is completed. In this state, a row selecting operation is carried out by the redundant row selection signals RXD0, RXD1, RXD2 and RXD3. Note that a P-channel MOS transistor 62 prevents the node $N_1$ from being in a floating state.

Figure 28:
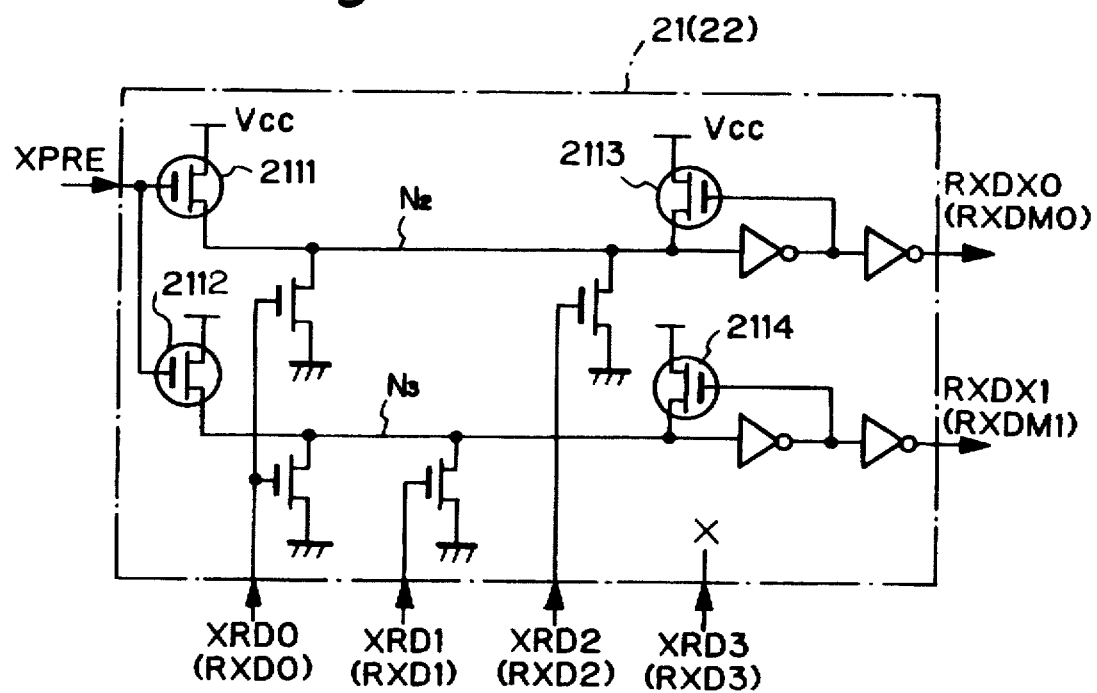
FIG. 28 is a circuit diagram of the encoder of FIGS. 9, 12, 15 and 26.

The encoder 21 (22) of FIGS. 9, 12, 15 and 26 can also be formed by a wired logic circuit as illustrated in FIG. 28. In FIG. 28, before a row selecting operation, a precharge signal XPRE is made low to turn ON P-channel MOS transistors 2111 and 2112, so that nodes $N_2$ and $N_3$ are precharged. Then, the precharge signal XPRE is made high to turn OFF the transistors 2111 and 2112, so that precharging of the nodes $N_1$ and $N_2$ are completed. In this state, a row selecting operation is carried out by the redundant row selection signals XRD0, XRD1, XRD2 and XRD3 (RXD0, RXD1, RXD2 and RXD3). Note that P-channel MOS transistors 2113 and 2114 prevent the nodes $N_2$ and $N_3$ from being in a floating state.

The present invention can be applied to a semiconductor memory device where columns of memory cells can be replaced by columns of redundant memory cells.

As explained hereinabove, according to the present invention, since the number of lines is reduced, the integration can be enhanced. Also, the freedom of replacement can be enhanced.

I claim:

1. A semiconductor or memory device comprising:

a plurality of memory cell blocks;

a plurality of redundant memory cell arrays each corresponding to one of said memory cell blocks;

first selecting means, connected to said memory cell blocks, for selecting memory cells from said memory cell blocks;

redundant selection signal generating means for generating redundant selection signals for said redundant memory cell arrays;

a redundant selection signal encoder, connected to said redundant signal generating means, for encoding said redundant selection signals into redundant encode signals;

second selecting means, connected to said redundant selection signal encoder, for decoding said redundant encode signals to select redundant memory cells from said redundant memory cell arrays; and deactivating means, connected between said redundant selection signal generating means and said first selecting means, for deactivating said first selecting means when one of said redundant selection signals is generated.

2. A semiconductor memory device comprising:

a plurality of memory cell blocks each including a plurality of memory cell rows;

a plurality of redundant memory cell rows;

a plurality of first row selecting means, connected to said memory cell blocks, for selecting one of said memory cell rows from said memory cell blocks;

redundant selection signal generating circuits for generating redundant selection signals each for selecting one of said redundant memory rows;

a redundant selection signal encoder, connected to said redundant selection signal generating circuits, for encoding said redundant selection signals into redundant encode signals;

a plurality of second row selecting means, connected between said redundant selection signal encoder and said redundant memory cell rows, for decoding said redundant encode signals to select one of said redundant memory cell rows; and a deactivating circuit, connected between said redundant selection signal generating circuits and said first row selecting means, for deactivating said first row selecting means when one of said redundant selection signals is generated.

3. The device as set forth in claim 2, wherein said redundant memory cells are divided into a plurality of groups, each being connected to one of main word lines, said second row selecting means comprising:
means for selecting one of said main word lines; and
means for selecting one of said redundant memory cell rows within each of said groups.

4. A semiconductor memory device comprising:

a plurality of memory cell blocks each including a plurality of memory cell rows which are divided into a plurality of first groups;

a plurality of main word lines each being connected to one of said first groups of memory cell rows;

a plurality of main word line selecting means, connected to said memory cell blocks, for selecting one of said main word lines in accordance with a first part of a row address;

a sub word line selecting means, connected to said memory cell blocks, for selecting one memory cell row within each of said first groups of memory cell rows in accordance with a second part of said row address;

a plurality of redundant memory cell rows divided into a plurality of second groups;

a plurality of redundant main word lines each being connected to one of said second groups of redundant memory cell rows;

a plurality of redundant selection signal generating circuits for generating redundant selection signals each for selecting one of said second groups of redundant memory cell rows, each of said redundant selection signal generating circuits storing a third part of said row address;

a plurality of redundant main word line selecting means, connected between said redundant selection signal generating circuits and said redundant main word lines, for selecting one of said redundant main word lines in accordance with said redundant selection signals;

a redundant memory cell row group selecting circuit, connected to said redundant selection signal generating circuits, for generating a group selection signal;

a redundant sub word line selecting circuit, connected to said redundant memory cell row group selecting circuit, for selecting one redundant memory cell row within each of said second groups of redundant memory cell rows in accordance with said group selection signal and said third part of said row address; and a deactivating circuit, connected between said redundant selection signal generating circuits and said main word line selecting means, for deactivating said main word line selecting means when one of said redundant selection signals is generated.

5. The device as set forth in claim 4, further comprising a redundant selection signal encoder, connected between said redundant selection signal generating circuits and said redundant main word line selecting means, for encoding said redundant selection signals into redundant encode signals, said redundant main word line selecting means including means for decoding said redundant encode signals.

6. The device as set forth in claim 4, wherein said sub word line selecting means and said redundant sub word line selecting means are combined into a single circuit which is operated in accordance with an output of said deactivating circuit.

7. A semiconductor memory device comprising:

a plurality of memory cell blocks each including a plurality of memory cell columns;

a plurality of redundant memory cell columns;

a plurality of first column selecting means, connected to said memory cell blocks, for selecting one of said memory cell columns from said memory cell blocks;

redundant selection signal generating circuits for generating redundant selection signals each for selecting one of said redundant memory columns;

a redundant selection signal encoder, connected to said redundant selection signal generating circuits, for encoding said redundant selection signals into redundant encode signals;

a plurality of second column selecting means, connected between said redundant selection signal encoder and said redundant memory cell columns, for decoding said redundant encode signals to select one of said redundant memory cell columns; and a deactivating circuit, connected between said redundant selection signal generating circuits and said first column detecting means, for deactivating said first column selecting means when one of said redundant selection signals is generated.

8. The device as set forth in claim 7, wherein said redundant memory cells are divided into a plurality of groups, each being connected to one of main column lines, said second column selecting means comprising:
means for selecting one of said main column lines; and
means for selecting one of said redundant memory cell columns within each of said groups.

* * * * *